United States Patent
Cornfeld et al.

(10) Patent No.: US 7,960,201 B2
(45) Date of Patent: Jun. 14, 2011

(54) STRING INTERCONNECTION AND FABRICATION OF INVERTED METAMORPHIC MULTIJUNCTION SOLAR CELLS

(75) Inventors: Arthur Cornfeld, Sandia Park, NM (US); Jacqueline Diaz, Albuquerque, NM (US); Tansen Varghese, Albuquerque, NM (US)

(73) Assignee: Emcore Solar Power, Inc., Albuquerque, NM (US)

( * ) Notice: Subject to any disclaimer, the term of this patent is extended or adjusted under 35 U.S.C. 154(b) by 149 days.

(21) Appl. No.: 12/362,201

(22) Filed: Jan. 29, 2009

(65) Prior Publication Data
US 2010/0233839 A1    Sep. 16, 2010

(51) Int. Cl.
*H01L 21/00* (2006.01)
(52) U.S. Cl. .............. 438/66; 257/E21.499; 136/255
(58) Field of Classification Search ............ 438/66; 136/255; 257/E21.499
See application file for complete search history.

(56) References Cited

U.S. PATENT DOCUMENTS

| | | |
|---|---|---|
| 3,488,834 A | 1/1970 | Baird |
| 3,964,155 A | 6/1976 | Leinkram et al. |
| 4,001,864 A | 1/1977 | Gibbons et al. |
| 4,255,211 A | 3/1981 | Fraas |
| 4,338,480 A | 7/1982 | Antypas et al. |
| 4,393,576 A | 7/1983 | Dahlberg |
| 4,612,408 A | 9/1986 | Moddel et al. |
| 4,881,979 A | 11/1989 | Lewis |
| 5,019,177 A | 5/1991 | Wanlass |
| 5,021,360 A | 6/1991 | Melman et al. |
| 5,053,083 A | 10/1991 | Sinton et al. |
| 5,217,539 A | 6/1993 | Fraas et al. |
| 5,298,085 A | 3/1994 | Harvey et al. |
| 5,322,572 A | 6/1994 | Wanlass et al. |
| 5,342,453 A | 8/1994 | Olson |
| 5,376,185 A | 12/1994 | Wanlass |
| 5,479,032 A | 12/1995 | Forrest et al. |
| 5,510,272 A | 4/1996 | Morikawa et al. |
| 5,944,913 A | 8/1999 | Hou et al. |
| 6,165,873 A | 12/2000 | Hamada |
| 6,180,432 B1 | 1/2001 | Freeouf |

(Continued)

FOREIGN PATENT DOCUMENTS
EP    1 109 230 A2    6/2001
(Continued)

OTHER PUBLICATIONS

R. Venkatasubramanian, et al., "An Inverted-Growth Approach to Development of an IR-Transparent, High-Efficiency AlGaAs/GaAs Cascade Solar Cell." 22$^{nd}$ IEEE Photovoltaic Specialists Conference, Oct. 7-11, 1991, Las Vegas, NV, USA.

(Continued)

*Primary Examiner* — Matthew Smith
*Assistant Examiner* — Christine Enad

(57) ABSTRACT

A method of manufacturing a solar cell by providing a first substrate; depositing on a first substrate a sequence of layers of semiconductor material forming a solar cell including at least a top subcell and a bottom subcell; mounting a surrogate substrate on top of the sequence of layers adjacent to the bottom subcell; removing the first substrate to expose the surface of the top subcell; removing the surrogate substrate; and holding the solar cell on a vacuum chuck to support it for subsequent fabrication operations, such as attaching interconnects to the solar cells to form an interconnected array.

20 Claims, 38 Drawing Sheets

U.S. PATENT DOCUMENTS

| | | | |
|---|---|---|---|
| 6,239,354 | B1 | 5/2001 | Wanlass et al. |
| 6,252,287 | B1 | 6/2001 | Kurtz et al. |
| 6,281,426 | B1 | 8/2001 | Olson et al. |
| 6,300,557 | B1 | 10/2001 | Wanlass et al. |
| 6,300,558 | B1 | 10/2001 | Takamoto et al. |
| 6,340,788 | B1 | 1/2002 | King et al. |
| 6,482,672 | B1 | 11/2002 | Hoffman et al. |
| 6,660,928 | B1 | 12/2003 | Patton et al. |
| 6,690,041 | B2 | 2/2004 | Armstrong et al. |
| 6,902,990 | B2 * | 6/2005 | Gottfried et al. ............... 438/463 |
| 6,951,819 | B2 | 10/2005 | Iles et al. |
| 7,071,407 | B2 | 7/2006 | Faterni et al. |
| 7,115,811 | B2 * | 10/2006 | Ho et al. ........................ 136/255 |
| 7,166,520 | B1 | 1/2007 | Henley |
| 7,727,795 | B2 | 6/2010 | Stan |
| 7,741,146 | B2 * | 6/2010 | Cornfeld et al. ................ 438/87 |
| 7,759,572 | B2 * | 7/2010 | Sharps et al. .................. 136/255 |
| 7,785,989 | B2 | 8/2010 | Sharps |
| 7,842,881 | B2 | 11/2010 | Cornfeld |
| 2002/0117675 | A1 | 8/2002 | Mascarenhas |
| 2003/0226952 | A1 | 12/2003 | Clark |
| 2004/0079408 | A1 | 4/2004 | Fetzer et al. |
| 2004/0166681 | A1 | 8/2004 | Iles et al. |
| 2004/0200523 | A1 | 10/2004 | King et al. |
| 2005/0211291 | A1 | 9/2005 | Bianchi |
| 2005/0272175 | A1 * | 12/2005 | Meier et al. ..................... 438/22 |
| 2005/0274411 | A1 | 12/2005 | King et al. |
| 2006/0021565 | A1 | 2/2006 | Zahler et al. |
| 2006/0112986 | A1 | 6/2006 | Atwater, Jr. et al. |
| 2006/0144435 | A1 | 7/2006 | Wanlass et al. |
| 2006/0162768 | A1 | 7/2006 | Wanlass et al. |
| 2006/0185582 | A1 | 8/2006 | Atwater, Jr. et al. |
| 2007/0079863 | A1 * | 4/2007 | Stan et al. ...................... 136/244 |
| 2007/0137694 | A1 | 6/2007 | Foster et al. |
| 2007/0218649 | A1 | 9/2007 | Hernandez |
| 2007/0277873 | A1 * | 12/2007 | Cornfeld et al. ............... 136/255 |
| 2008/0029151 | A1 | 2/2008 | McGlynn |
| 2008/0149173 | A1 | 6/2008 | Sharps |
| 2008/0185038 | A1 | 8/2008 | Sharps |
| 2008/0245409 | A1 * | 10/2008 | Varghese et al. ............... 136/256 |
| 2009/0038679 | A1 | 2/2009 | Varghese |
| 2009/0078308 | A1 | 3/2009 | Varghese |
| 2009/0078309 | A1 | 3/2009 | Stan |
| 2009/0078310 | A1 | 3/2009 | Stan |
| 2009/0078311 | A1 | 3/2009 | Stan |
| 2009/0155952 | A1 | 6/2009 | Stan |
| 2009/0188546 | A1 | 7/2009 | McGlynn |
| 2009/0223554 | A1 | 9/2009 | Sharps |
| 2009/0229658 | A1 | 9/2009 | Stan |
| 2009/0229662 | A1 | 9/2009 | Stan |
| 2009/0272430 | A1 | 11/2009 | Cornfeld |
| 2009/0272438 | A1 | 11/2009 | Cornfeld |
| 2009/0288703 | A1 | 11/2009 | Stan |
| 2009/0314348 | A1 | 12/2009 | McGlynn |
| 2010/0012174 | A1 | 1/2010 | Varghese |
| 2010/0012175 | A1 | 1/2010 | Varghese |
| 2010/0031994 | A1 | 2/2010 | Varghese |
| 2010/0047959 | A1 | 2/2010 | Cornfeld |
| 2010/0093127 | A1 | 4/2010 | Sharps |
| 2010/0109115 | A1 * | 5/2010 | Ure ............................... 257/443 |
| 2010/0116327 | A1 | 5/2010 | Cornfeld |
| 2010/0122724 | A1 | 5/2010 | Cornfeld |
| 2010/0122764 | A1 | 5/2010 | Newman |
| 2010/0147366 | A1 | 6/2010 | Stan |
| 2010/0186804 | A1 | 7/2010 | Cornfeld |
| 2010/0203730 | A1 | 8/2010 | Cornfeld |
| 2010/0206365 | A1 | 8/2010 | Chumney |
| 2010/0229913 | A1 | 9/2010 | Cornfeld |
| 2010/0229926 | A1 | 9/2010 | Newman |
| 2010/0229932 | A1 | 9/2010 | Cornfeld |
| 2010/0229933 | A1 | 9/2010 | Cornfeld |
| 2010/0233838 | A1 | 9/2010 | Varghese |
| 2010/0236615 | A1 | 9/2010 | Sharps |
| 2010/0248411 | A1 | 9/2010 | Cornfeld |
| 2010/0282288 | A1 | 11/2010 | Cornfeld |
| 2011/0030774 | A1 | 2/2011 | Cornfeld |
| 2011/0041898 | A1 | 2/2011 | Cornfeld |

FOREIGN PATENT DOCUMENTS

| | | |
|---|---|---|
| EP | 1 863 099 A2 | 12/2007 |
| EP | 0 658 944 B1 | 4/2009 |
| FR | 2 878 076 A1 | 5/2006 |
| WO | WO 2005/015638 A1 | 2/2005 |

OTHER PUBLICATIONS

R. Venkatasubramanian, et al., "High-quality eutectic-metal-bonded AlGaAs—GaAs thin films on Si substrates." Applied Physics Letters, vol. 60, No. 7, pp. 886-888. Feb. 17, 1992. American Institute of Physics, Melville, NY, USA.

M. Yamaguchi, "Physics and Technologies of Superhigh-Effficiency Tandem Solar Cells." Semiconductors, vol. 33, No. 9, Sep. 1999, pp. 961-964. Toyota Technological Institute, Nagoya, Japan. © 1999, American Institute of Physics.

R.R. King, et al., "Next-Generation, High-Efficiency III-V Multijunction Solar Cells." 28$^{th}$ IEEE Photovoltaic Specialists Conference, Sep. 15-22, 2000, Anchorage, AK, USA.

S. Sinharoy, et al., "Progress in the Development of Metamorphic Multi-junction III-V Space Solar Cells." Progress in Photovoltaics: Research and Applications, vol. 10, Feb. 2002, pp. 427-432. John Wiley & Sons, Ltd. Hoboken, NJ, USA.

R.R. King, et al., "High-Efficiency Space and Terrestrial Multijunction Solar Cells Through Bandgap Control in Cell Structures." 2002 Photovoltaic Specialists Conference, Conference Record of the 29$^{th}$ IEEE, May 19-24, 2002, pp. 776-781. New Orleans, LA, USA.

M.W. Wanlass et al., "Lattice-Mismatched Approaches for High-Performance, III-V Photovoltaic Energy Converters." Proceedings of the 31$^{st}$ IEEE PVSC, Jan. 3-7, 2005, Lake Buena Vista, FL, USA.

Takamoto, T., et al., "InGaP/GaAs-based Multijunction Solar Cells." Progress in Photovoltaics: Research and Applications, 2005; vol. 13, pp. 495-511. Wiley InterScience, John Wiley & Sons, Ltd., Hoboken, NJ.

M.W. Wanlass et al., "Monolithic, Ultra-Thin GaInP/GaAs/GaInAs Tandem Solar Cells." 2006 IEEE 4$^{th}$ World Conference on Photovoltaic Energy Conversion, May 7-12, 2006, Waikoloa, Hawaii, USA.

D.J. Friedman, et al., "0.7-eV GaInAs Junction for a GaInP/GaAs/GaInAs(1eV)/GaInAs(0.7eV) Four-Junction Solar Cell." 2006 IEEE 4$^{th}$ World Conference on Photovoltaic Energy Conversion, May 7-12, 2006, Waikoloa, Hawaii, USA.

J.F. Geisz, et al., "High-efficiency GaInP/GaAs/InGaAs triple-junction solar cells grown inverted with a metamorphic bottom junction." Applied Physics Letters 91, 023502 (2007), pp. 023502-1-023502-3. Online publication Jul. 10, 2007. American Institute of Physics, Melville, NY, USA.

P. Sharps, et al., "Inverting the triple junction improves efficiency and flexibility." Compound Semiconductor. Oct. 2007, pp. 25-28. IOP Publishing, Ltd., Bristol, England.

H. Yoon, et al., "Progress of Inverted Metamorphic III-V Solar Cell Development at Spectrolab." 33$^{rd}$ IEEE Photovoltaic Specialists Conference, May 11-16, 2008, San Diego, CA, USA.

J.F. Geisz, et al., "Inverted GaInP / (In)GaAs / InGaAs Triple-Junction Solar Cells with Low-Stress Metamorphic Bottom Junctions." 33$^{rd}$ IEEE Photovoltaic Specialists Conference, May 11-16, 2008, San Diego, CA, USA.

A. Cornfeld, et al., "Development of a Large Area Inverted Metamorphic Multi-junction (IMM) Highly Efficient AM0 Solar Cell." 33$^{rd}$ IEEE Photovoltaic Specialists Conference, May 11-16, 2008, San Diego, CA, USA.

A. Cornfeld, et al., "Development of a Large Area Inverted Metamorphic Multi-junction Highly Efficient AM0 Solar Cell." Conference paper presented at the 33$^{rd}$ IEEE Photovoltaic Specialists Conference (May 11-16, 2008) on May 12, 2008. San Diego, CA, USA. 17 pages.

M. Stan, et al., "Very High Efficiency Triple Junction Solar Cells by MOVPE." 14$^{th}$ International Conference of Metalorganic Vapor Phase Epitaxy. Jun. 1-6, 2008, Metz, France.

A. Cornfeld, et al., "Advances in the Performance of Inverted Metamorphic Multi-junction Solar Cells." 23$^{rd}$ European Photovoltaic Energy Conference, Sep. 1-5, 2008, Valencia, Spain.

"Partial European Search Report," Application No. EP 08 01 3466. Feb. 12, 2009. European Patent Office, Berlin, Germany.
"European Search Report," Application No. EP 08 01 3466. Dec. 18, 2009. European Patent Office, Berlin, Germany.
P. Wurfel. Physics of Solar Cells: from Basic Principles to Advanced Concepts. $2^{nd}$, Updated and Expanded Edition. 2009. Sections 6.4, 6.5 and 6.8. 20 pages. Wiley-VCH, Weinheim, Germany.
U.S. Appl. No. 12/265,113, filed Nov. 5, 2008, Varghese.
U.S. Appl. No. 12/708,361, filed Feb. 18, 2010, Cornfeld.
U.S. Appl. No. 12/716,814, filed Mar. 3, 2010, Cornfeld.
U.S. Appl. No. 12/730,018, filed Mar. 23, 2010, Cornfeld.
U.S. Appl. No. 12/756,926, filed Apr. 8, 2010, Cornfeld.
U.S. Appl. No. 12/775,946, filed May 10, 2010, Newman.
U.S. Appl. No. 12/813,408, filed Jun. 10, 2010, Patel.
U.S. Appl. No. 12/844,673, filed Jul. 27, 2010, Stan.

Office Action mailed Jan. 4, 2011. U.S. Appl. No. 11/445,793. (Sexl reference, double patenting rejection).
Sexl, M., et al., "MBE Growth of Metamorphic In(Ga)AlAs Buffers." 1997 IEEE International Symposium on Compound Semiconductors. Sep. 1997, pp. 49-52. IEEE, Piscataway, NJ.
Advisory Action mailed Mar. 15, 2011. U.S. Appl. No. 11/445,793.
Stan, M., et al., "High-efficiency quadruple junction solar cells using OMVPE with inverted metamorphic device structures." Journal of Crystal Growth 312 (2010), pp. 1370-1374. Elsevier, Amsterdam, Netherlands.
Takamoto, T., et al., "Future Development of InGaP/(In)GaAs Based Multijunction Solar Cells." Proceedings of the $31^{th}$ IEEE PVSC, Jan. 3-7, 2005, pp. 519-524. Lake Buena Vista, FL.

* cited by examiner ns STRING INTERCONNECTION AND FABRICATION OF INVERTED METAMORPHIC MULTIJUNCTION SOLAR CELLS

GOVERNMENT RIGHTS STATEMENT

This invention was made with government support under Contract No. FA9453-06-C-0345 awarded by the U.S. Air Force. The Government has certain rights in the invention.

REFERENCE TO RELATED APPLICATIONS

This application is related to co-pending U.S. patent application Ser. No. 12/362,213 and Ser. No. 12/362,225 filed simultaneously herewith.

This application is related to co-pending U.S. patent application Ser. No. 12/337,014 and Ser. No. 12/337,043 filed Dec. 17, 2008.

This application is related to co-pending U.S. patent application Ser. No. 12/271,127 and Ser. No. 12/271,192 filed Nov. 14, 2008.

This application is related to co-pending U.S. patent application Ser. No. 12/267,812 filed Nov. 10, 2008.

This application is related to co-pending U.S. patent application Ser. No. 12/258,190 filed Oct. 24, 2008.

This application is related to co-pending U.S. patent application Ser. No. 12/253,051 filed Oct. 16, 2008.

This application is related to co-pending U.S. patent application Ser. No. 12/190,449, filed Aug. 12, 2008.

This application is related to co-pending U.S. patent application Ser. No. 12/187,477, filed Aug. 7, 2008.

This application is related to co-pending U.S. patent application Ser. No. 12/218,558 and U.S. patent application Ser. No. 12/218,582 filed Jul. 16, 2008.

This application is related to co-pending U.S. patent application Ser. No. 12/123,864 filed May 20, 2008.

This application is related to co-pending U.S. patent application Ser. No. 12/102,550 filed Apr. 14, 2008.

This application is related to co-pending U.S. patent application Ser. No. 12/047,842, and U.S. Ser. No. 12/047,944, filed Mar. 13, 2008.

This application is related to co-pending U.S. patent application Ser. No. 12/023,772 filed Jan. 31, 2008.

This application is related to co-pending U.S. patent application Ser. No. 11/956,069 filed Dec. 13, 2007.

This application is also related to co-pending U.S. patent application Ser. Nos. 11/860,142 and 11/860,183 filed Sep. 24, 2007.

This application is also related to co-pending U.S. patent application Ser. No. 11/836,402 filed Aug. 9, 2007.

This application is also related to co-pending U.S. patent application Ser. No. 11/616,596 filed Dec. 27, 2006.

This application is also related to co-pending U.S. patent application Ser. No. 11/614,332 filed Dec. 21, 2006.

This application is also related to co-pending U.S. patent application Ser. No. 11/445,793 filed Jun. 2, 2006.

This application is also related to co-pending U.S. patent application Ser. No. 11/500,053 filed Aug. 7, 2006.

BACKGROUND OF THE INVENTION

1. Field of the Invention

The present invention relates to the field of semiconductor devices, and to fabrication processes and devices such as multijunction solar cells based on III-V semiconductor compounds including a metamorphic layer. Such devices are also known as inverted metamorphic multijunction solar cells.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500x), commercially available III-V compound semiconductor multijunction solar cells in terrestrial applications (at AM1.5D) have energy efficiencies that exceed 37%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads become more sophisticated, the power-to-weight ratio of a solar cell becomes increasingly more important, and there is increasing interest in lighter weight, "thin film" type solar cells having both high efficiency and low mass.

Typical III-V compound semiconductor solar cells are fabricated on a semiconductor wafer in vertical, multijunction structures. The individual solar cells or wafers are then disposed in horizontal arrays, with the individual solar cells connected together in an electrical series circuit. The shape and structure of an array, as well as the number of cells it contains, are determined in part by the desired output voltage and current.

Inverted metamorphic solar cell structures based on III-V compound semiconductor layers, such as described in M. W. Wanlass et al., Lattice Mismatched Approaches for High Performance, III-V Photovoltaic Energy Converters (Conference Proceedings of the 31$^{st}$ IEEE Photovoltaic Specialists Conference, Jan. 3-7, 2005, IEEE Press, 2005), present an important conceptual starting point for the development of future commercial high efficiency solar cells. However, the materials and structures for a number of different layers of the cell proposed and described in such reference present a number of practical difficulties, particularly relating to the most appropriate choice of materials and fabrication steps.

SUMMARY OF THE INVENTION

Briefly, and in general terms, the present invention provides a method of forming a multijunction solar cell comprising an upper subcell, a middle subcell, and a lower subcell comprising: providing a first substrate for the epitaxial growth of semiconductor material; forming an upper first solar subcell on said first substrate having a first band gap;

forming a middle second solar subcell over said first solar subcell having a second band gap smaller than said first band gap; forming a graded interlayer over said second solar cell; forming a lower third solar subcell over said graded interlayer having a fourth band gap smaller than said second band gap such that said third subcell is lattice mismatched with respect to said second subcell, and including a metal contact layer; attaching a surrogate second substrate over said third solar subcell and removing said first substrate; and etching a first trough around the periphery of said solar cell to the metal contact layer so as to form a mesa structure on said surrogate second substrate and at least one bottom contact pad on said metal layer.

In another aspect the present invention provides a method of manufacturing a solar cell comprising providing a first substrate; depositing on a first substrate a sequence of layers of semiconductor material forming a solar cell including at least a top subcell and a bottom subcell; mounting a surrogate substrate on top of the sequence of layers adjacent to the bottom subcell; removing the first substrate to expose the surface of the top subcell; removing the surrogate substrate; and holding the solar cell on a vacuum chuck to support it for subsequent fabrication operations.

Some implementations of the present invention may incorporate or implement fewer of the aspects and features noted in the foregoing summaries.

Additional aspects, advantages, and novel features of the present invention will become apparent to those skilled in the art from this disclosure, including the following detailed description as well as by practice of the invention. While the invention is described below with reference to preferred embodiments, it should be understood that the invention is not limited thereto. Those of ordinary skill in the art having access to the teachings herein will recognize additional applications, modifications and embodiments in other fields, which are within the scope of the invention as disclosed and claimed herein and with respect to which the invention could be of utility.

BRIEF DESCRIPTION OF THE DRAWINGS

The invention will be better and more fully appreciated by reference to the following detailed description when considered in conjunction with the accompanying drawings, wherein.

DESCRIPTION OF THE PREFERRED EMBODIMENT

Figure 1:
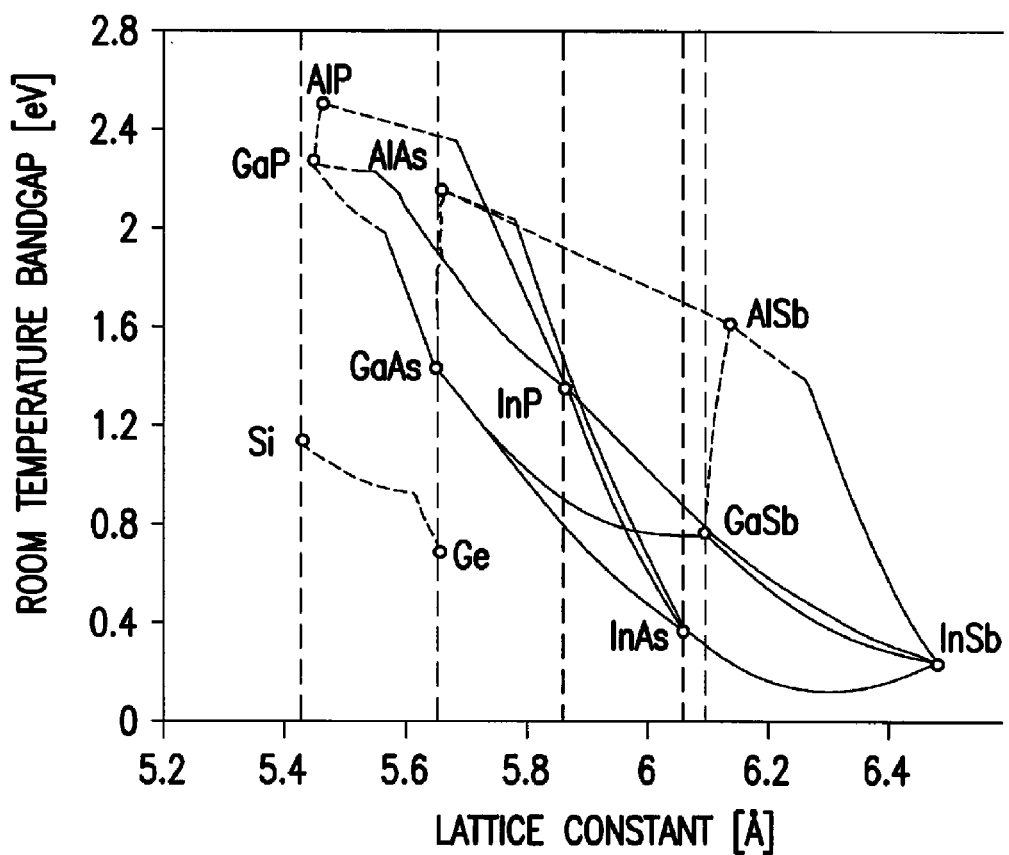
FIG. 1 is a graph representing the band gap of certain binary materials and their lattice constants.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

The basic concept of fabricating an inverted metamorphic multijunction (IMM) solar cell is to grow the subcells of the solar cell on a substrate in a "reverse" sequence. That is, the high band gap subcells (i.e. subcells with band gaps in the range of 1.8 to 2.1 eV), which would normally be the "top" subcells facing the solar radiation, are initially grown epitaxially directly on a semiconductor growth substrate, such as for example GaAs or Ge, and such subcells are consequently lattice-matched to such substrate. One or more lower band gap middle subcells (i.e. with band gaps in the range of 1.2 to 1.8 eV) can then be grown on the high band gap subcells.

At least one lower subcell is formed over the middle subcell such that the at least one lower subcell is substantially lattice mismatched with respect to the growth substrate and such that the at least one lower subcell has a third lower band gap (i.e., a band gap in the range of 0.7 to 1.2 eV). A surrogate substrate or support structure is then attached or provided over the "bottom" or substantially lattice mismatched lower subcell, and the growth semiconductor substrate is subsequently removed. (The growth substrate may then subsequently be re-used for the growth of a second and subsequent solar cells).

A variety of different features and aspects of inverted metamorphic multijunction solar cells are disclosed in the related applications noted above. Some or all of such features may be included in the structures and processes associated with the solar cells of the present invention. More particularly, one aspect of the present application is directed to the method of forming a bottom contact pad to the lower subcell, and another aspect is the use of a vacuum chuck to support the solar cell for certain fabrication operations. Neither, some or all of such aspects may be included in the structures and processes associated with the solar cells of the present invention.

It should be apparent to one skilled in the art that the inclusion of additional semiconductor layers within the cell with similar or additional functions and properties is also within the scope of the present invention.

FIG. 1 is a graph representing the band gap of certain binary materials and their lattice constants. The band gap and lattice constants of ternary materials are located on the lines drawn between typical associated binary materials (such as the ternary material GaAlAs being located between the GaAs and AlAs points on the graph, with the band gap of the ternary material lying between 1.42 eV for GaAs and 2.16 eV for AlAs depending upon the relative amount of the individual constituents). Thus, depending upon the desired band gap, the material constituents of ternary materials can be appropriately selected for growth.

The lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OMVPE), Metal Organic Chemical Vapor Deposition (MOCVD), Molecular Beam Epitaxy (MBE), or other vapor deposition methods for the reverse growth may enable the layers in the monolithic semiconductor structure forming the cell to be grown with the required thickness, elemental composition, dopant concentration and grading and conductivity type.

Figure 2:
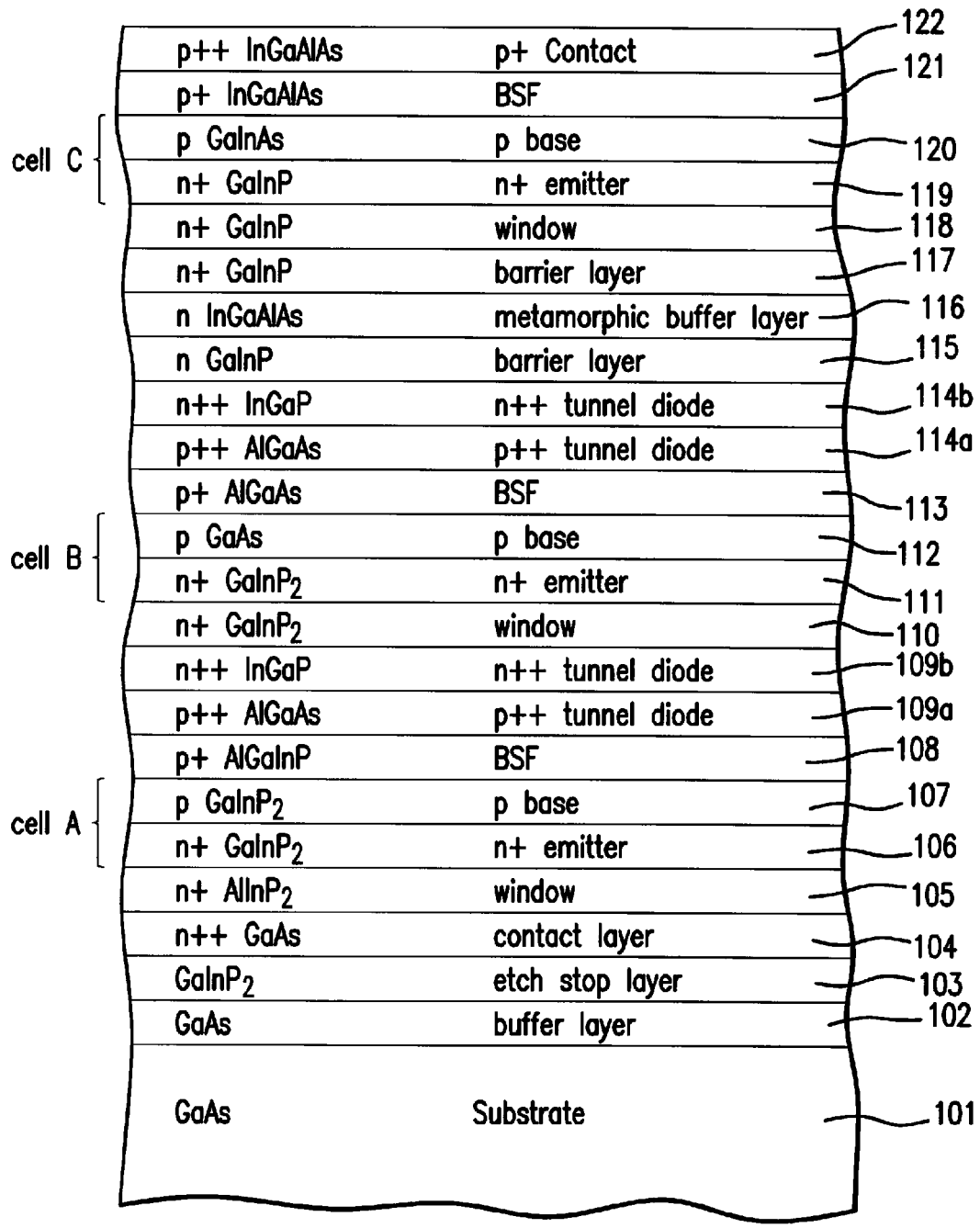
FIG. 2 is a cross-sectional view of the solar cell of the invention after the deposition of semiconductor layers on the growth substrate.

FIG. 2 depicts the multijunction solar cell according to the present invention after the sequential formation of the three subcells A, B and C on a GaAs growth substrate. More particularly, there is shown a substrate 101, which is preferably gallium arsenide (GaAs), but may also be germanium (Ge) or other suitable material. For GaAs, the substrate is preferably a 15° off-cut substrate, that is to say, its surface is orientated 15° off the (100) plane towards the (111)A plane, as more fully described in U.S. patent application Ser. No. 12/047, 944, filed Mar. 13, 2008. Other alternative growth substrates, such as described in U.S. patent application Ser. No. 12/337, 014 filed Dec. 17, 2008, may be used as well.

In the case of a Ge substrate, a nucleation layer (not shown) is deposited directly on the substrate 101. On the substrate, or over the nucleation layer (in the case of a Ge substrate), a buffer layer 102 and an etch stop layer 103 are further deposited. In the case of GaAs substrate, the buffer layer 102 is preferably GaAs. In the case of Ge substrate, the buffer layer 102 is preferably InGaAs. A contact layer 104 of GaAs is then deposited on layer 103, and a window layer 105 of AlInP is deposited on the contact layer. The subcell A, consisting of an n+ emitter layer 106 and a p-type base layer 107, is then epitaxially deposited on the window layer 105. The subcell A is generally lattice matched to the growth substrate 101.

It should be noted that the multijunction solar cell structure could be formed by any suitable combination of group III to V elements listed in the periodic table subject to lattice constant and band gap requirements, wherein the group III includes boron (B), aluminum (Al), gallium (Ga), indium (In), and thallium (Tl). The group IV includes carbon (C), silicon (Si), germanium (Ge), and tin (Sn). The group V includes nitrogen (N), phosphorus (P), arsenic (As), antimony (Sb), and bismuth (Bi).

In the preferred embodiment, the emitter layer 106 is composed of InGa(Al)P and the base layer 107 is composed of InGa(Al)P. The aluminum or Al term in parenthesis in the preceding formula means that Al is an optional constituent, and in this instance may be used in an amount ranging from 0% to 30%. The doping profile of the emitter and base layers 106 and 107 according to the present invention will be discussed in conjunction with FIG. 16.

Subcell A will ultimately become the "top" subcell of the inverted metamorphic structure after completion of the process steps according to the present invention to be described hereinafter.

On top of the base layer 107 a back surface field ("BSF") layer 108 preferably p+ AlGaInP is deposited and used to reduce recombination loss.

The BSF layer 108 drives minority carriers from the region near the base/BSF interface surface to minimize the effect of recombination loss. In other words, the BSF layer 108 reduces recombination loss at the backside of the solar subcell A and thereby reduces the recombination in the base.

On top of the BSF layer 108 is deposited a sequence of heavily doped p-type and n-type layers 109a and 109b that form a tunnel diode, i.e. an ohmic circuit element that connects subcell A to subcell B. Layer 109a is preferably composed of p++ AlGaAs, and layer 109b is preferably composed of n++ InGaP.

On top of the tunnel diode layers 109 a window layer 110 is deposited, preferably n+ InGaP. The advantage of utilizing InGaP as the material constituent of the window layer 110 is that it has an index of refraction that closely matches the adjacent emitter layer 111, as more fully described in U.S. patent application Ser. No. 12/258,190, filed Oct. 24, 2008. More generally, the window layer 110 used in the subcell B operates to reduce the interface recombination loss. It should be apparent to one skilled in the art that additional layer(s) may be added or deleted in the cell structure without departing from the scope of the present invention.

On top of the window layer 110 the layers of subcell B are deposited: the n-type emitter layer 111 and the p-type base layer 112. These layers are preferably composed of InGaP and $In_{0.015}GaAs$ respectively (for a Ge substrate or growth template), or InGaP and GaAs respectively (for a GaAs substrate), although any other suitable materials consistent with lattice constant and band requirements may be used as well. Thus, subcell B may be composed of a GaAs, GaInP, GaInAs, GaAsSb, or GaInAsN emitter region and a GaAs, GaInAs, GaAsSb, or GaInAsN base region. The doping profile of layers 111 and 112 according to the present invention will be discussed in conjunction with FIG. 16.

In previously disclosed implementations of an inverted metamorphic solar cell, the middle cell was a homostructure. In the present invention, similarly to the structure disclosed in U.S. patent application Ser. No. 12/023,772, the middle subcell becomes a heterostructure with an InGaP emitter and its window is converted from InAlP to InGaP. This modification eliminated the refractive index discontinuity at the window/emitter interface of the middle sub-cell. Moreover, the window layer 110 is preferably doped more than that of the emitter 111 to move the Fermi level up closer to the conduction band and therefore create band bending at the window/emitter interface which results in constraining the minority carriers to the emitter layer.

In one embodiment of the present invention, the middle subcell emitter has a band gap equal to the top subcell emitter, and the bottom subcell emitter has a band gap greater than the band gap of the base of the middle subcell. Therefore, after fabrication of the solar cell, and implementation and operation, neither the emitters of middle subcell B nor the bottom subcell C will be exposed to absorbable radiation. Substantially all of the photons representing absorbable radiation will be absorbed in the bases of cells B and C, which have narrower band gaps than the emitters. Therefore, the advantages of using heterojunction subcells are: (i) the short wavelength response for both subcells will improve, and (ii) the bulk of the radiation is more effectively absorbed and collected in the narrower band gap base. The effect will be to increase the short circuit current $J_{sc}$.

On top of the cell B is deposited a BSF layer 113 which performs the same function as the BSF layer 109. The p++/n++ tunnel diode layers 114a and 114b respectively are deposited over the BSF layer 113, similar to the layers 109a and 109b, forming an ohmic circuit element to connect subcell B to subcell C. The layer 114a is preferably composed of p++ AlGaAs, and layer 114b is preferably composed of n++ InGaP.

A barrier layer 115, preferably composed of n-type InGa(Al)P, is deposited over the tunnel diode 114a/114b, to a thickness of about 1.0 micron. Such barrier layer is intended to prevent threading dislocations from propagating, either opposite to the direction of growth into the middle and top subcells B and A, or in the direction of growth into the bottom subcell C, and is more particularly described in copending U.S. patent application Ser. No. 11/860,183, filed Sep. 24, 2007.

A metamorphic layer (or graded interlayer) 116 is deposited over the barrier layer 115 using a surfactant. Layer 116 is preferably a compositionally step-graded series of InGaAlAs layers, preferably with monotonically changing lattice constant, so as to achieve a gradual transition in lattice constant in the semiconductor structure from subcell B to subcell C while minimizing threading dislocations from occurring. The band gap of layer 116 is constant throughout its thickness, preferably approximately equal to 1.5 eV, or otherwise consistent with a value slightly greater than the band gap of the middle subcell B. One embodiment of the graded interlayer may also be expressed as being composed of $(In_xGa_{1-x})_yAl_{1-y}As$, with x and y selected such that the band gap of the interlayer remains constant at approximately 1.50 eV or other appropriate band gap.

In the surfactant assisted growth of the metamorphic layer 116, a suitable chemical element is introduced into the reactor during the growth of layer 116 to improve the surface characteristics of the layer. In the preferred embodiment, such element may be a dopant or donor atom such as selenium (Se) or tellurium (Te). Small amounts of Se or Te are therefore incorporated in the metamorphic layer 116, and remain in the finished solar cell. Although Se or Te are the preferred n-type dopant atoms, other non-isoelectronic surfactants may be used as well.

Surfactant assisted growth results in a much smoother or planarized surface. Since the surface topography affects the bulk properties of the semiconductor material as it grows and the layer becomes thicker, the use of the surfactants minimizes threading dislocations in the active regions, and therefore improves overall solar cell efficiency.

As an alternative to the use of non-isoelectronic surfactants one may use an isoelectronic surfactant. The term "isoelectronic" refers to surfactants such as antimony (Sb) or bismuth (Bi), since such elements have the same number of valence electrons as the P atom of InGaP, or the As atom in InGaAlAs, in the metamorphic buffer layer. Such Sb or Bi surfactants will not typically be incorporated into the metamorphic layer 116.

In an alternative embodiment where the solar cell has only two subcells, and the "middle" cell B is the uppermost or top subcell in the final solar cell, wherein the "top" subcell B would typically have a band gap of 1.8 to 1.9 eV, then the band gap of the interlayer would remain constant at 1.9 eV.

In the inverted metamorphic structure described in the Wanlass et al. paper cited above, the metamorphic layer consists of nine compositionally graded InGaP steps, with each step layer having a thickness of 0.25 micron. As a result, each layer of Wanlass et al. has a different band gap. In one embodiment of the present invention, the layer 116 is composed of a plurality of layers of InGaAlAs, with monotonically changing lattice constant, each layer having the same band gap, approximately 1.5 eV.

The advantage of utilizing a constant band gap material such as InGaAlAs is that arsenide-based semiconductor material is much easier to process in standard commercial MOCVD reactors, while the small amount of aluminum assures radiation transparency of the metamorphic layers.

Although one embodiment of the present invention utilizes a plurality of layers of InGaAlAs for the metamorphic layer 116 for reasons of manufacturability and radiation transparency, other embodiments of the present invention may utilize different material systems to achieve a change in lattice constant from subcell B to subcell C. Thus, the system of Wanlass using compositionally graded InGaP is a second embodiment of the present invention. Other embodiments of the present invention may utilize continuously graded, as opposed to step graded, materials. More generally, the graded interlayer may be composed of any of the As, P, N, Sb based III-V compound semiconductors subject to the constraints of having the in-plane lattice parameter greater or equal to that of the second solar cell and less than or equal to that of the third solar cell, and having a band gap energy greater than that of the second solar cell.

In another embodiment of the present invention, an optional second barrier layer 117 may be deposited over the InGaAlAs metamorphic layer 116. The second barrier layer 117 will typically have a different composition than that of barrier layer 115, and performs essentially the same function of preventing threading dislocations from propagating. In one embodiment, barrier layer 117 is n+ type GaInP.

A window layer 118 preferably composed of n+ type GaInP is then deposited over the barrier layer 117 (or directly over layer 116, in the absence of a second barrier layer). This window layer operates to reduce the recombination loss in subcell "C". It should be apparent to one skilled in the art that additional layers may be added or deleted in the cell structure without departing from the scope of the present invention.

On top of the window layer 118, the layers of cell C are deposited: the n+ emitter layer 119, and the p-type base layer 120. These layers are preferably composed of n+ type InGaAs and p type InGaAs respectively, or n+ type InGaP and p type InGaAs for a heterojunction subcell, although other suitable materials consistent with lattice constant and band gap requirements may be used as well. The doping profile of layers 119 and 120 will be discussed in connection with FIG. 16.

A BSF layer 121, preferably composed of InGaAlAs, is then deposited on top of the cell C, the BSF layer performing the same function as the BSF layers 108 and 113.

Finally a high band gap contact layer 122, preferably composed of InGaAlAs, is deposited on the BSF layer 121.

This contact layer added to the bottom (non-illuminated) side of a lower band gap photovoltaic cell, in a single or a multijunction photovoltaic cell, can be formulated to reduce absorption of the light that passes through the cell, so that (1) an ohmic metal contact layer below (non-illuminated side) it will also act as a mirror layer, and (2) the contact layer doesn't have to be selectively etched off, to prevent absorption.

It should be apparent to one skilled in the art, that additional layer(s) may be added or deleted in the cell structure without departing from the scope of the present invention.

Figure 3:
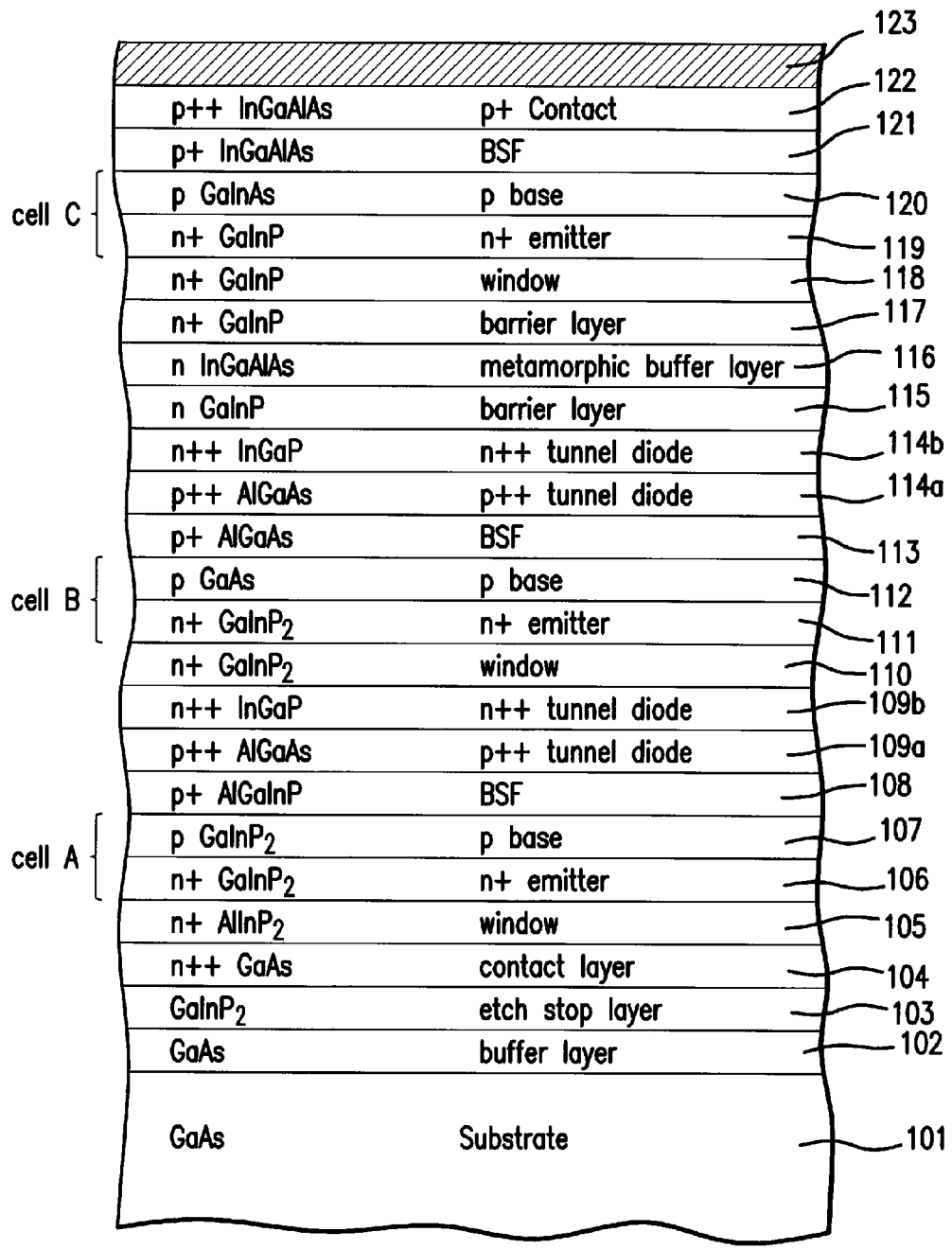
FIG. 3 is a cross-sectional view of the solar cell of FIG. 2 after the next process step.

FIG. 3 is a cross-sectional view of the solar cell of FIG. 2 after the next process step in which a metal contact layer 123 is deposited over the p+ semiconductor contact layer 122. The metal is preferably the sequence of metal layers Ti/Au/Ag/Au or Ti/Pd/Ag, although other suitable sequences and materials may be used as well.

Also, the metal contact scheme chosen is one that has a planar interface with the semiconductor, after heat treatment to activate the ohmic contact. This is done so that (i) a dielectric layer separating the metal from the semiconductor doesn't have to be deposited and selectively etched in the metal contact areas; and (ii) the contact layer is specularly reflective over the wavelength range of interest.

Figure 4:
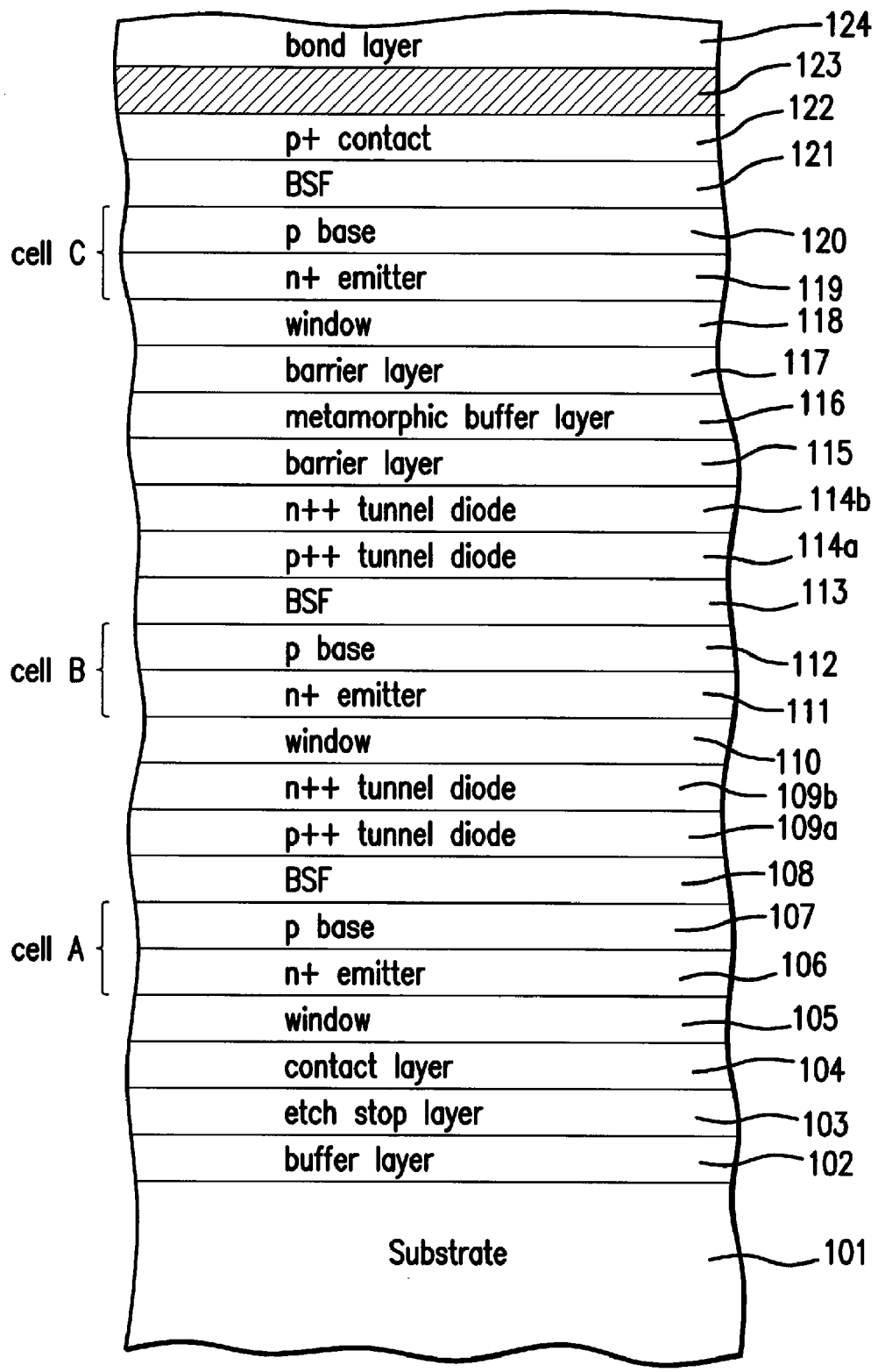
FIG. 4 is a cross-sectional view of the solar cell of FIG. 3 after the next process step.

FIG. 4 is a cross-sectional view of the solar cell of FIG. 3 after the next process step in which a bonding layer 124 is deposited over the metal layer 123. In one embodiment of the present invention, the bonding layer is an adhesive, preferably Wafer Bond (manufactured by Brewer Science, Inc. of Rolla, Mo.). In other embodiments of the present invention, a solder or eutectic bonding layer 124, such as described in U.S. patent application Ser. No. 12/271,127 filed Nov. 14, 2008, or a bonding layer 124 such as described in U.S. patent application Ser. No. 12/265,113 filed Nov. 5, 2008, may be used, where the surrogate substrate remains a permanent supporting component of the finished solar cell.

Figure 5A:
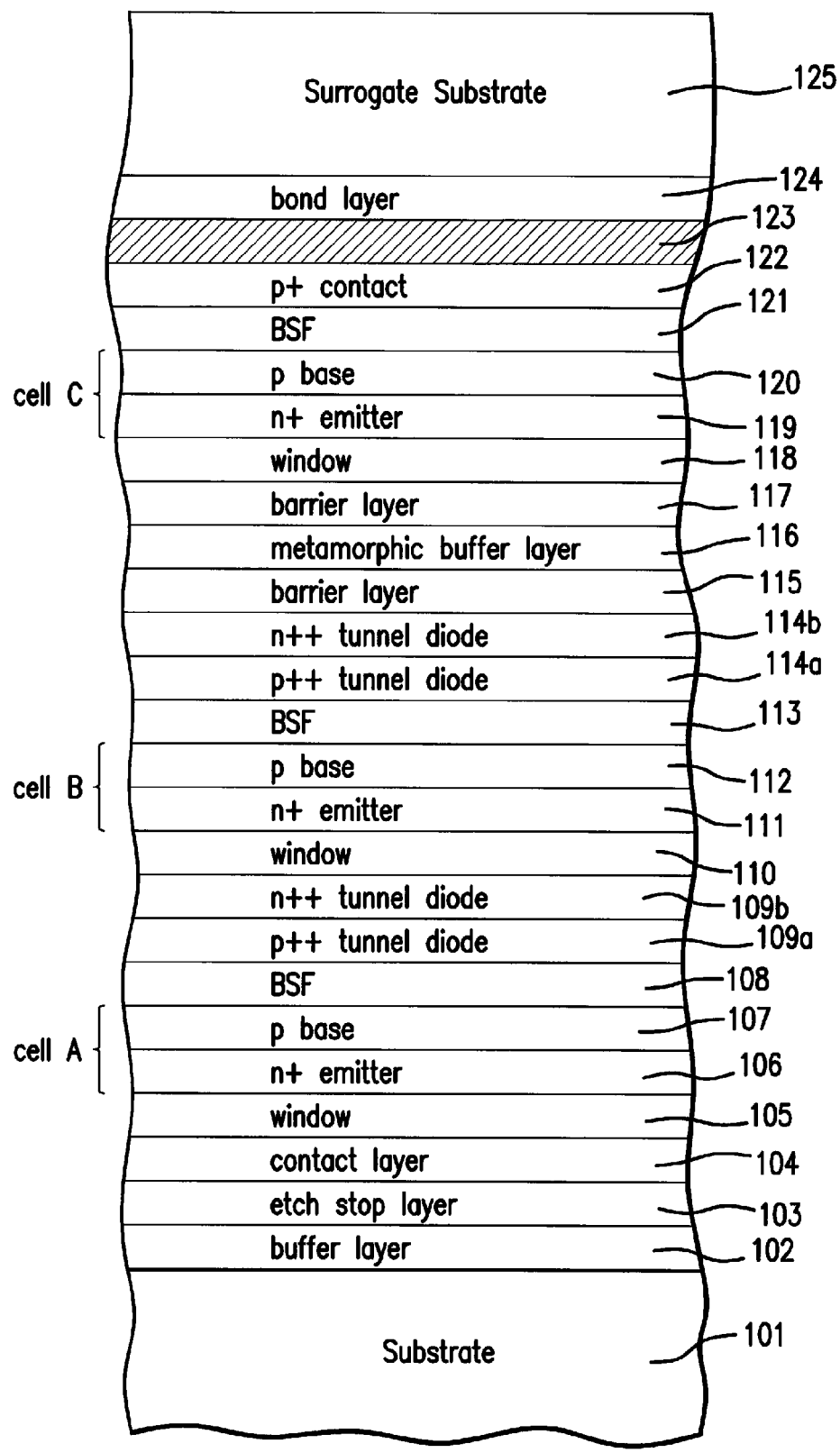
FIG. 5A is a cross-sectional view of the solar cell of FIG. 4 after the next process step in which a surrogate substrate is attached.

FIG. 5A is a cross-sectional view of the solar cell of FIG. 4 after the next process step in which a surrogate substrate 125, preferably sapphire, is attached. Alternatively, the surrogate substrate may be GaAs, Ge or Si, or other suitable material. The surrogate substrate is about 40 mils in thickness, and in the case of embodiments in which the surrogate substrate is to be removed, it is perforated with holes about 1 mm in diameter, spaced 4 mm apart, to aid in subsequent removal of the adhesive and the substrate.

Figure 5B:
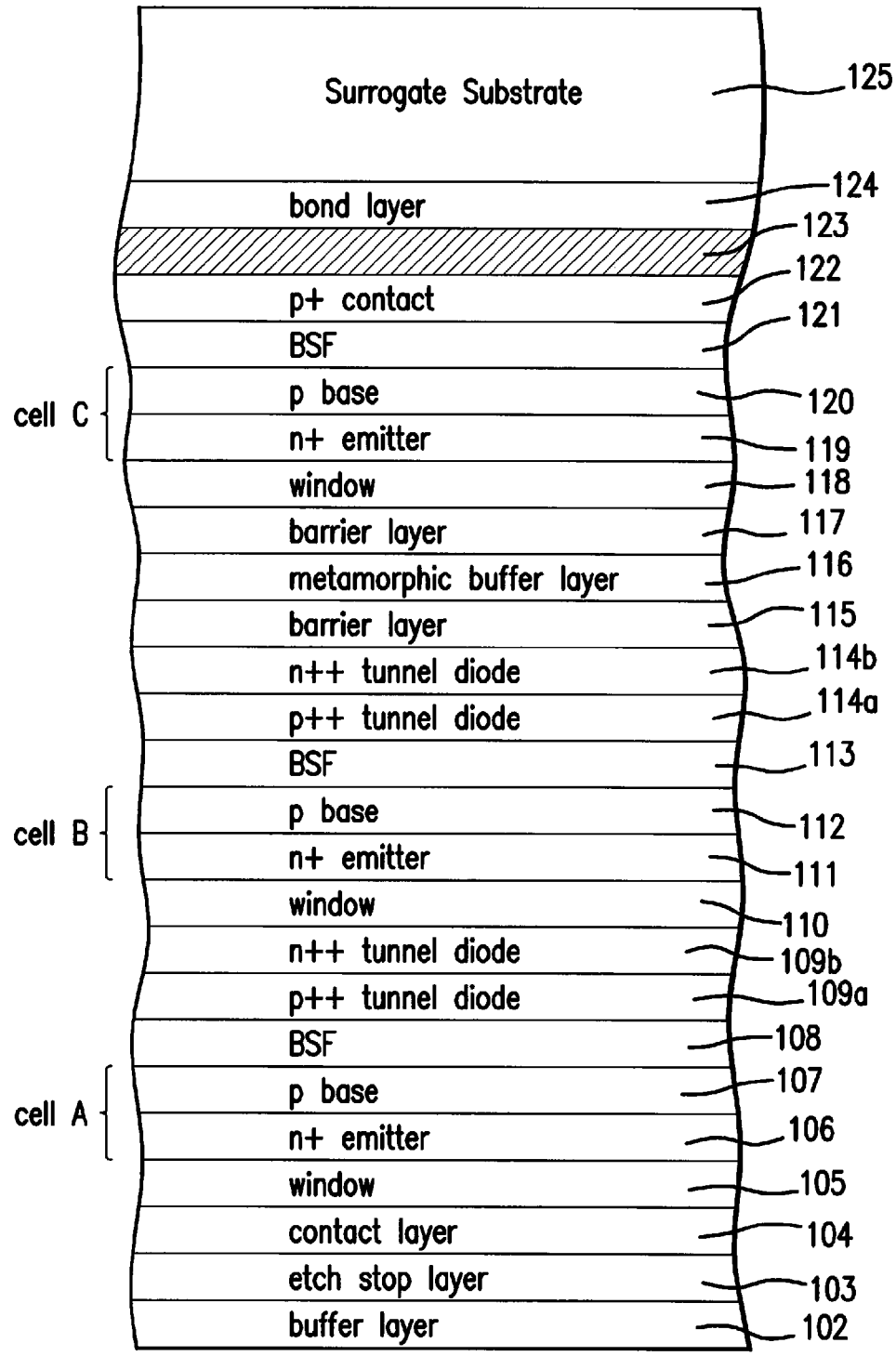
FIG. 5B is a cross-sectional view of the solar cell of FIG. 5A after the next process step in which the original substrate is removed.

FIG. 5B is a cross-sectional view of the solar cell of FIG. 5A after the next process step in which the original substrate is removed by a sequence of lapping, grinding and/or etching steps in which the substrate 101, and the buffer layer 102 are removed. The choice of a particular etchant is growth substrate dependent.

Figure 5C:
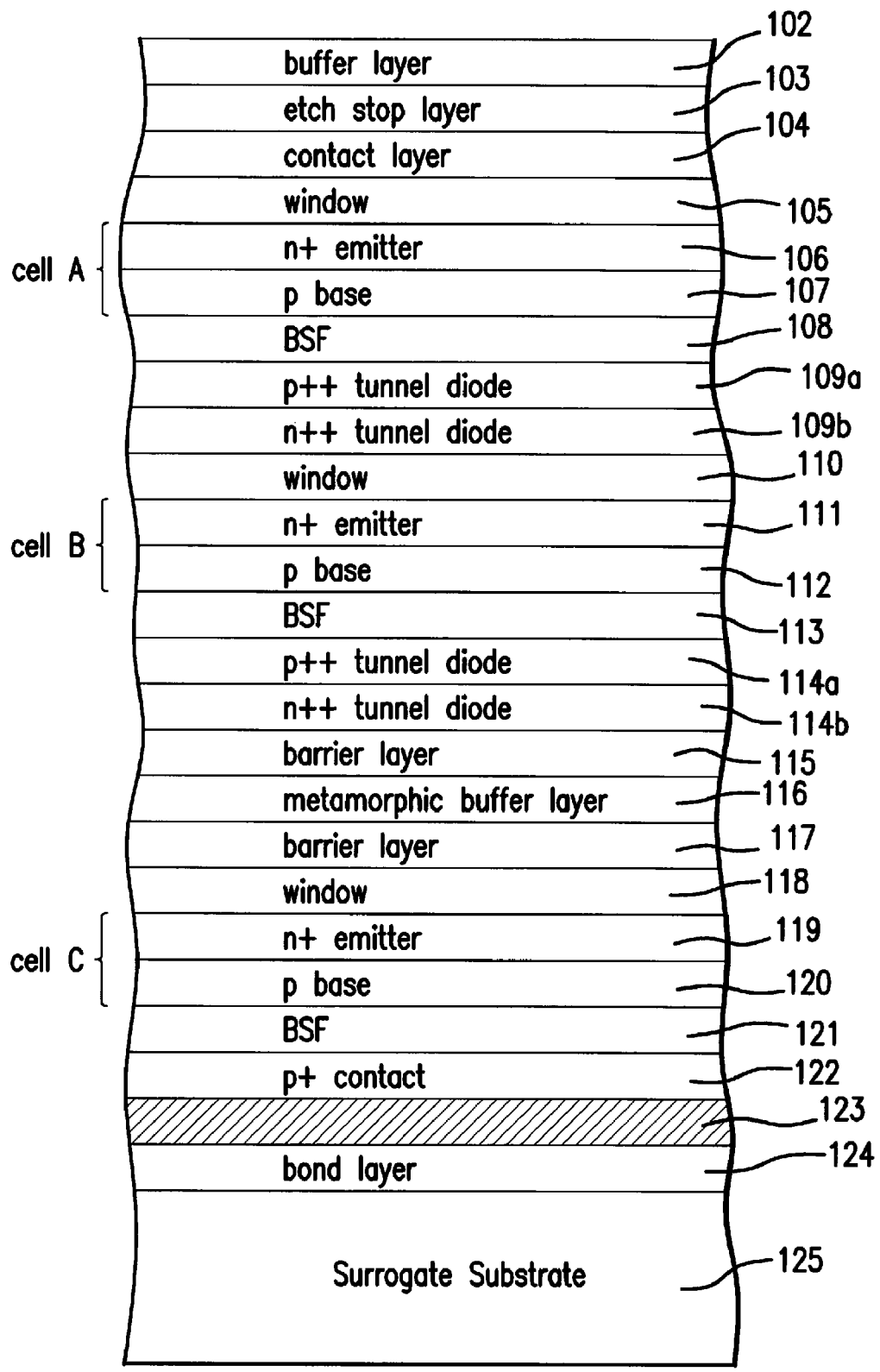
FIG. 5C is another cross-sectional view of the solar cell of FIG. 5B with the surrogate substrate on the bottom of the Figure.

FIG. 5C is a cross-sectional view of the solar cell of FIG. 5B with the orientation with the surrogate substrate 125 being at the bottom of the Figure. Subsequent Figures in this application will assume such orientation.

Figure 6:
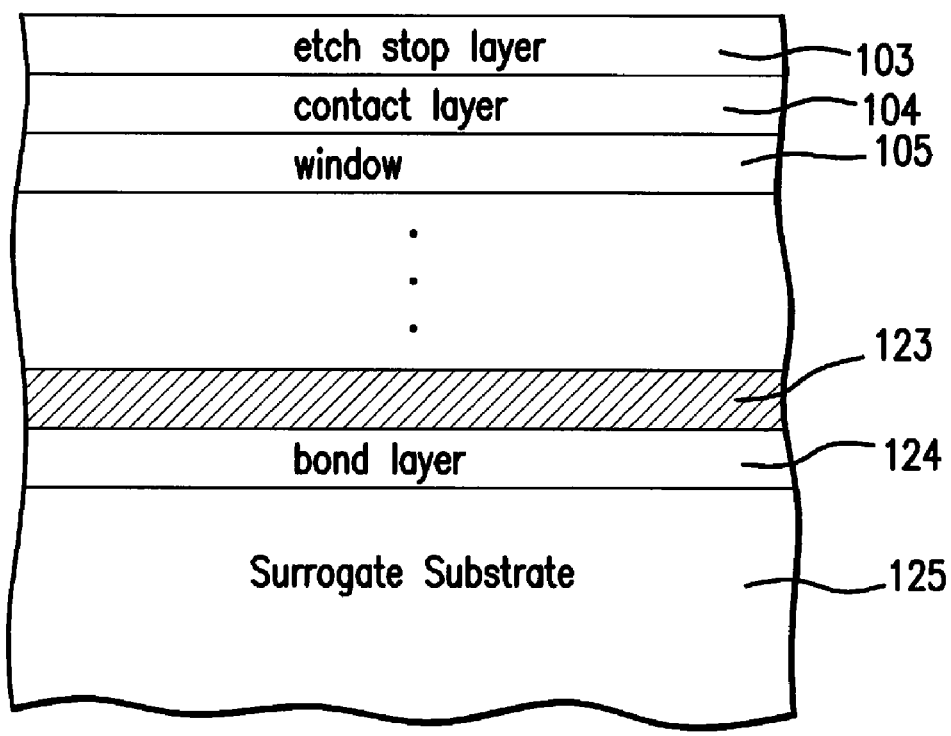
FIG. 6 is a simplified cross-sectional view of the solar cell of FIG. 5C after the next process step.

FIG. 6 is a simplified cross-sectional view of the solar cell of FIG. 5B depicting just a few of the top layers and lower layers over the surrogate substrate 125.

Figure 7:
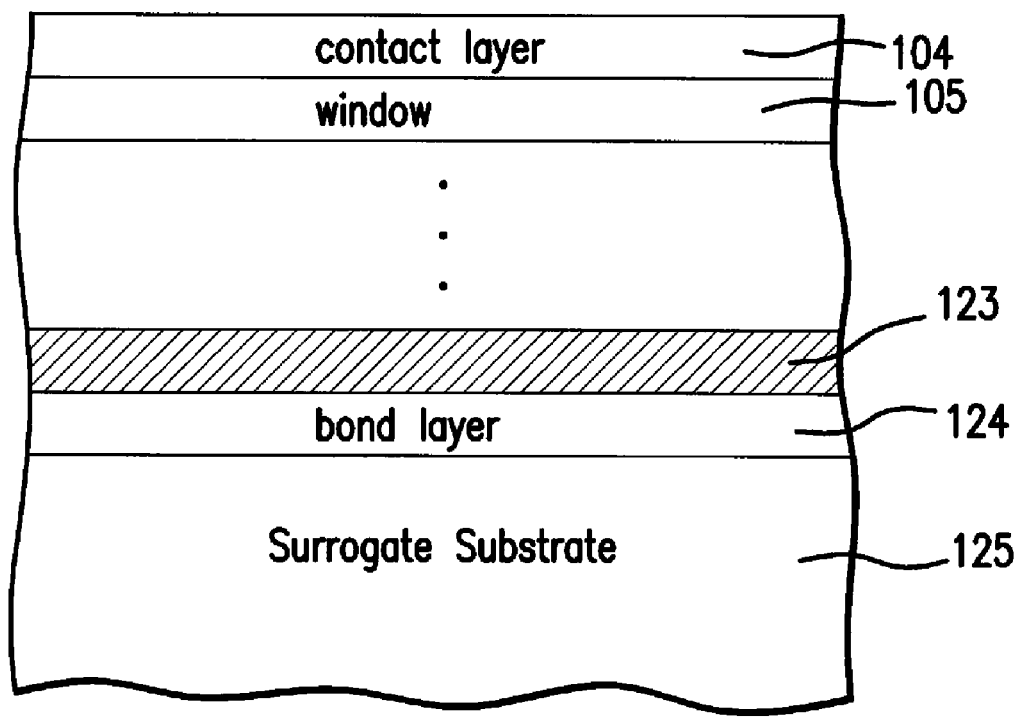
FIG. 7 is a cross-sectional view of the solar cell of FIG. 6 after the next process step.

FIG. 7 is a cross-sectional view of the solar cell of FIG. 6 after the next process step in which the etch stop layer 103 is removed by a HCl/H$_2$O solution.

Figure 8:
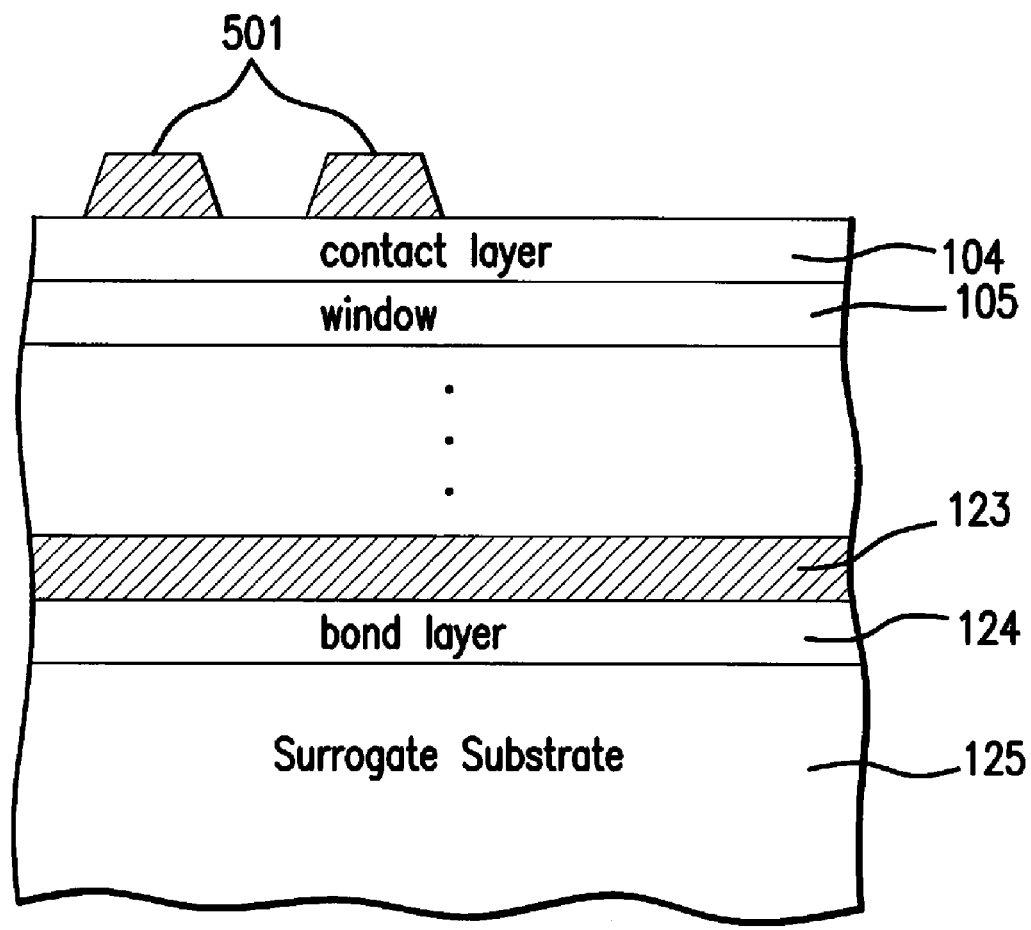
FIG. 8 is a cross-sectional view of the solar cell of FIG. 7 after the next process step.

FIG. 8 is a cross-sectional view of the solar cell of FIG. 7 after the next sequence of process steps in which a photoresist mask (not shown) is placed over the contact layer 104 to form the grid lines 501. As will be described in greater detail below, the grid lines 501 are deposited via evaporation and lithographically patterned and deposited over the contact layer 104. The mask is subsequently lifted off to form the finished metal grid lines 501 as depicted in the Figures.

As more fully described in U.S. patent application Ser. No. 12/218,582 filed Jul. 16, 2008, hereby incorporated by reference, the grid lines 501 are preferably composed of the sequence of layers Pd/Ge/Ti/Pd/Au, although other suitable sequences and materials may be used as well.

Figure 9:
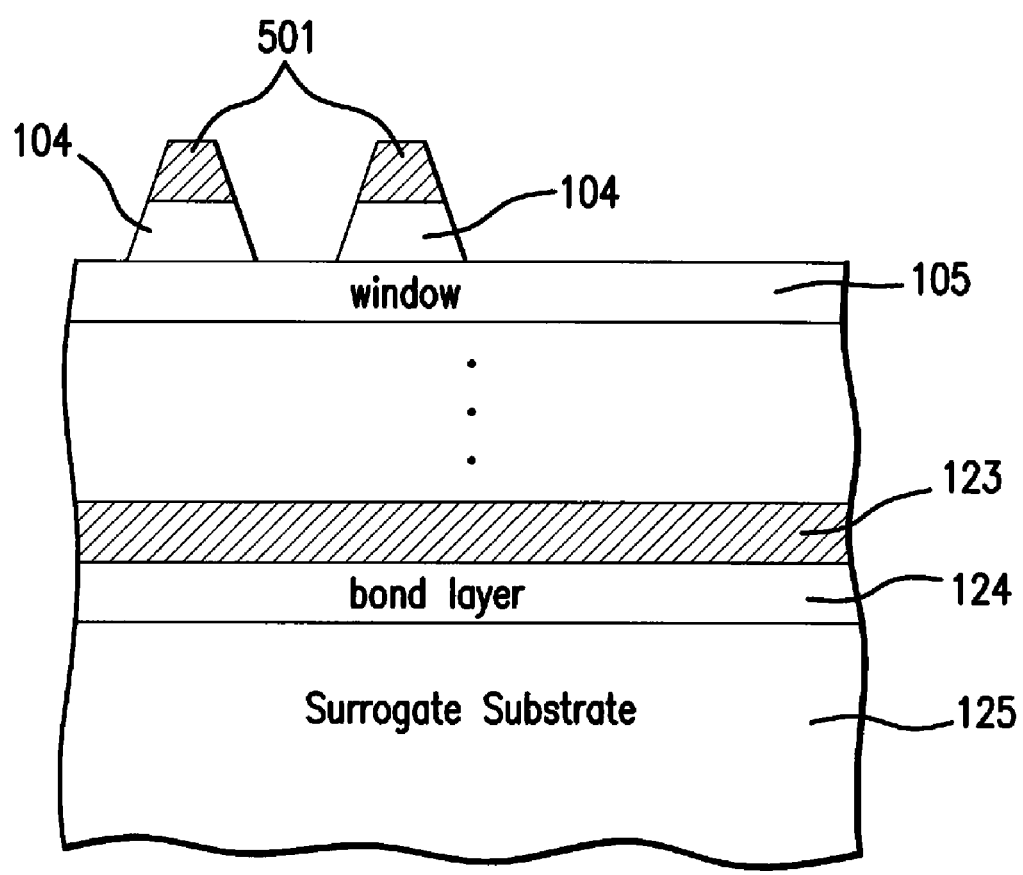
FIG. 9 is a cross-sectional view of the solar cell of FIG. 8 after the next process step.

FIG. 9 is a cross-sectional view of the solar cell of FIG. 8 after the next process step in which the grid lines are used as a mask to etch down the surface to the window layer 105 using a citric acid/peroxide etching mixture.

Figure 10A:
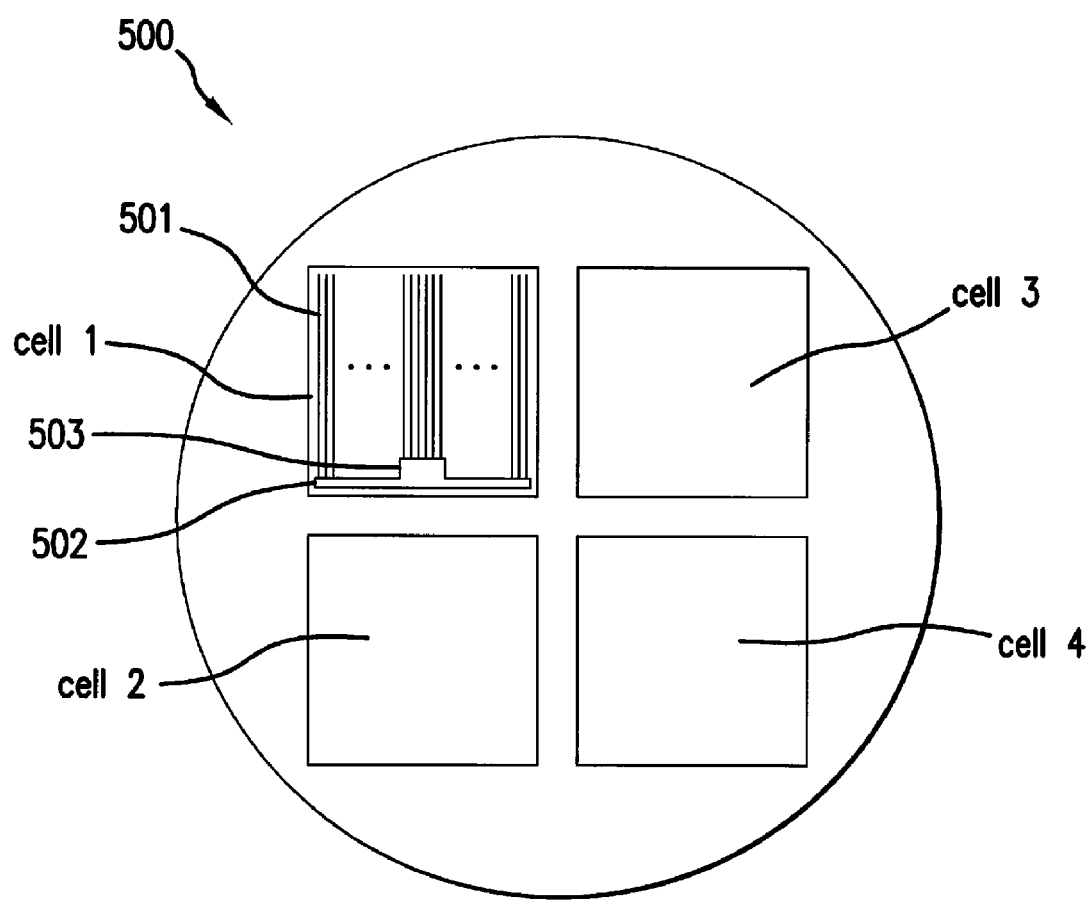
FIG. 10A is a top plan view of a wafer in which four solar cells are fabricated.

FIG. 10A is a top plan view of a 100 mm (or 4 inch) wafer in which four solar cells are implemented. The depiction of four cells is for illustration purposes only, and the present invention is not limited to any specific number of cells per wafer.

In each cell there are grid lines 501 (more particularly shown in cross-section in FIG. 9), an interconnecting bus line 502, and a contact pad 503. The geometry and number of grid and bus lines and contact pads are illustrative, and the present invention is not limited to the illustrated embodiment.

Figure 10B:
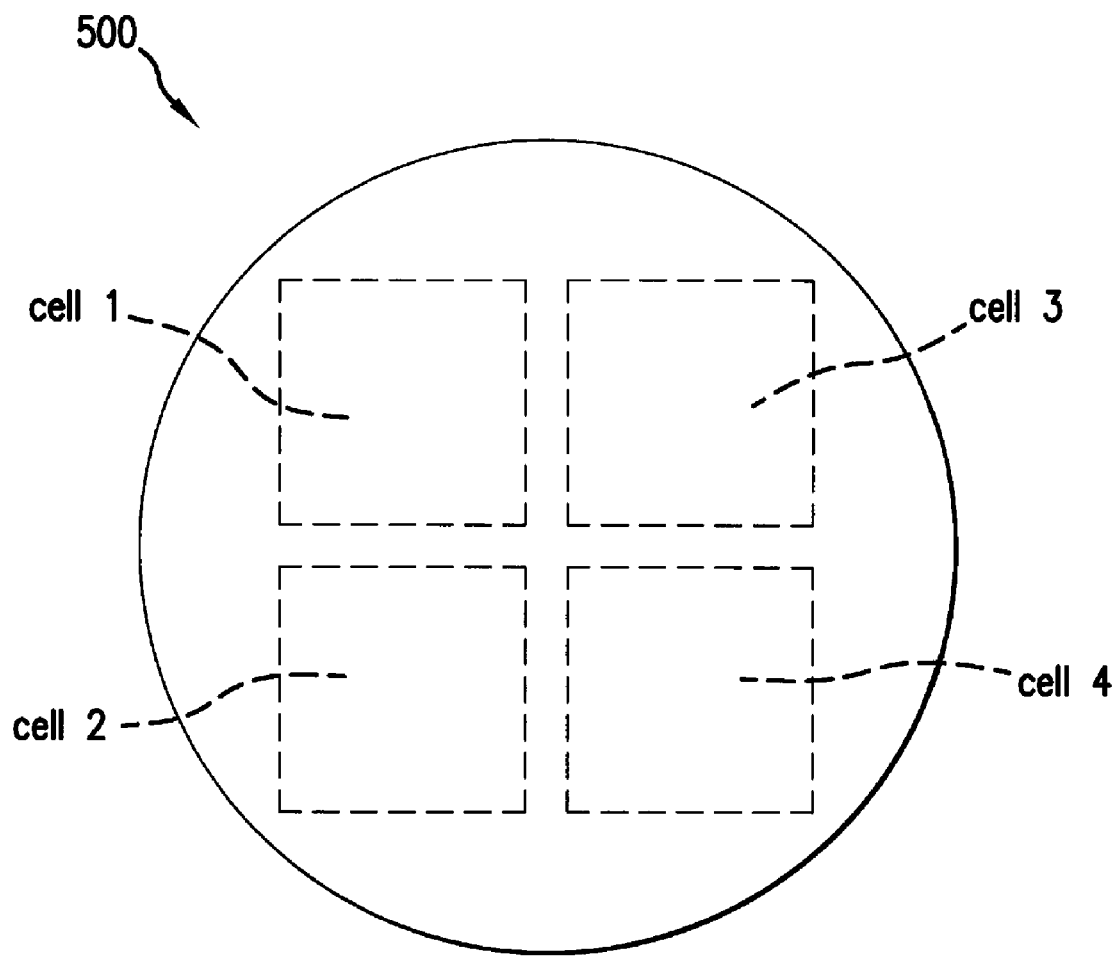
FIG. 10B is a bottom plan view of the wafer of FIG. 10A.

FIG. 10B is a bottom plan view of the wafer of FIG. 10A.

Figure 10C:
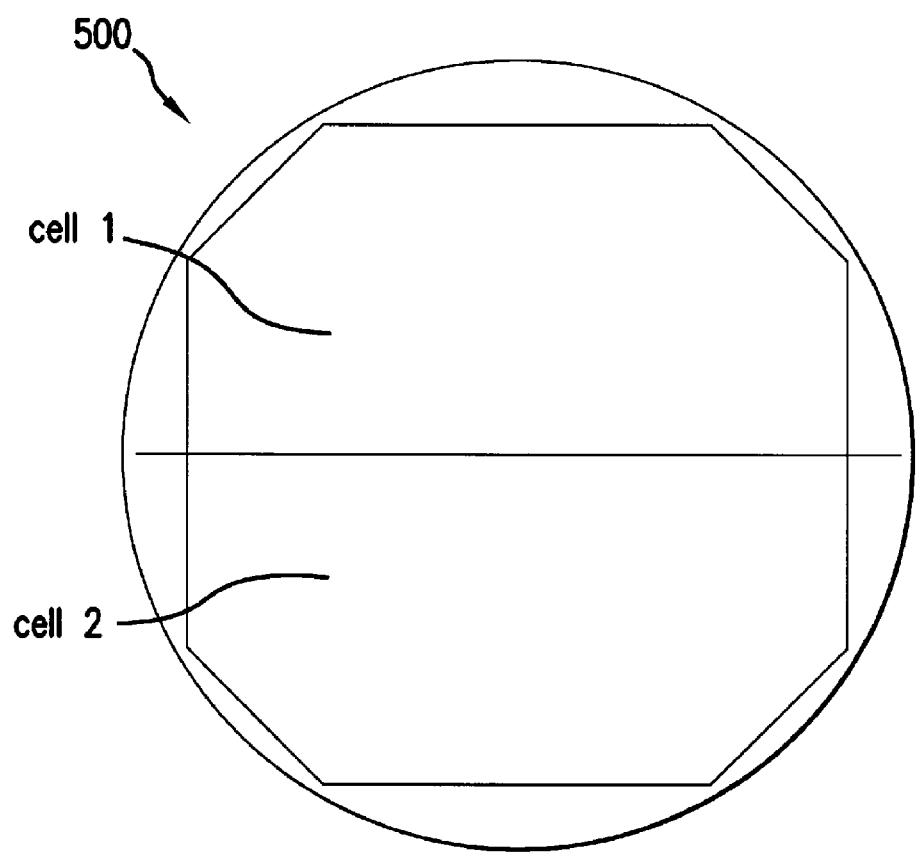
FIG. 10C is a top plan view of a wafer in which two solar cells are fabricated.

FIG. 10C is a top plan view of a 100 mm (or 4 inch) wafer in which two solar cells are implemented. Each solar cell has an area of 26.3 cm$^2$ and after fabrication will have a power/weight ratio (after separation from the growth and surrogate substrates, and including a 4 mil thick cover glass) of 945 mW/g.

Figure 11:
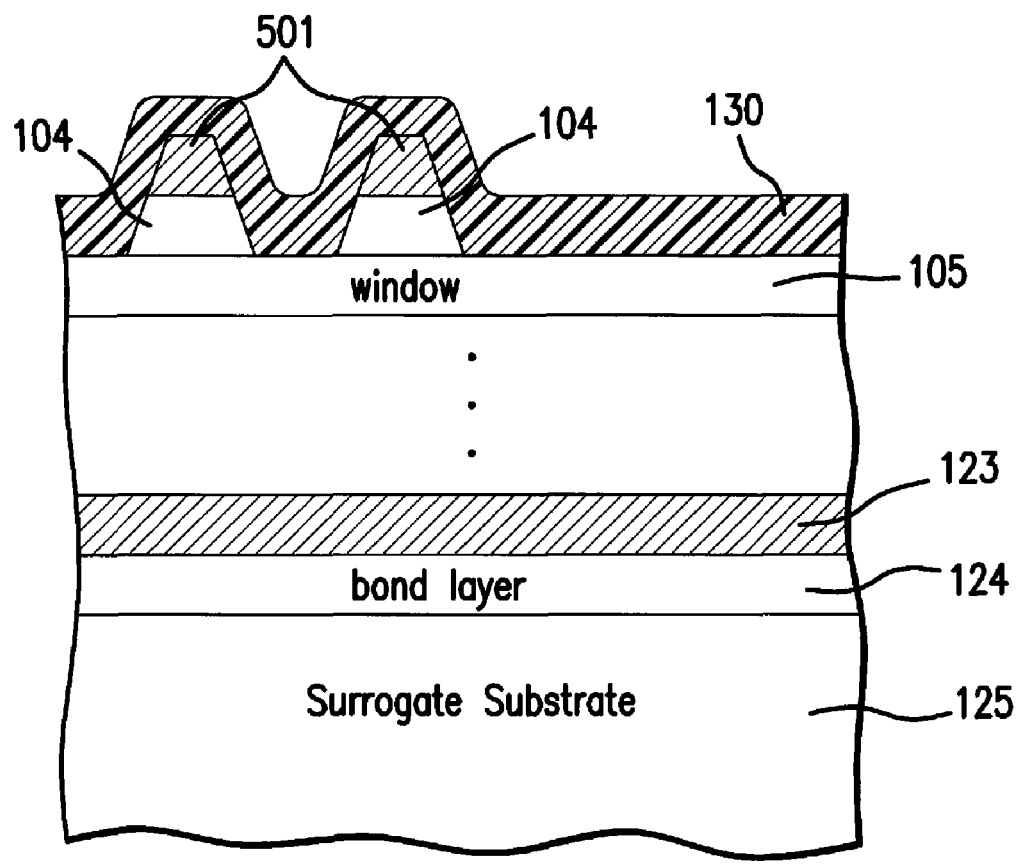
FIG. 11 is a cross-sectional view of the solar cell of FIG. 9 after the next process step.

FIG. 11 is a cross-sectional view of the solar cell of FIG. 9 after the next process step in which an antireflective (ARC) dielectric coating layer 130 is applied over the entire surface of the "top" side of the wafer with the grid lines 501.

Figure 12A:
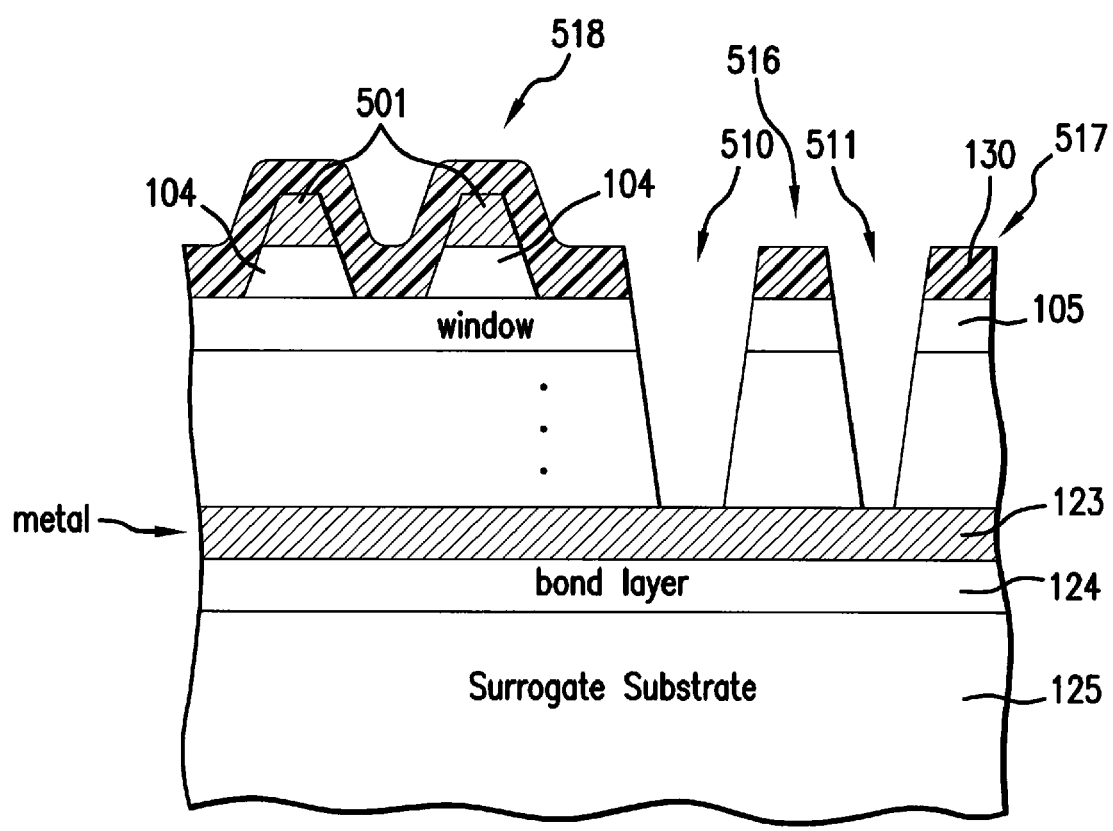
FIG. 12A is a cross-sectional view of the solar cell of FIG. 11 after the next process step.

FIG. 12A is a cross-sectional view of the solar cell of FIG. 11 after the next process step according to the present invention in which first and second annular channels 510 and 511, or portion of the semiconductor structure are etched down to the metal layer 123 using phosphide and arsenide etchants. These channels, as more particularly described in U.S. patent application Ser. No. 12/190,449, filed Aug. 12, 2008, define a peripheral boundary between the cell, a surrounding mesa 516, and a periphery mesa 517 at the edge of the wafer, and leave a mesa structure 518 which constitutes the solar cell. The cross-section depicted in FIG. 12A is that as seen from the A-A plane shown in FIG. 13A FIG. 12B is a cross-sectional view of the solar cell of FIG. 12A after the next process step in which channel 511 is exposed to a metal etchant, layer 123 in the channel 511 is removed, and channel 511 is extended in depth approximately to the top surface of the bond layer 124.

Figure 13A:
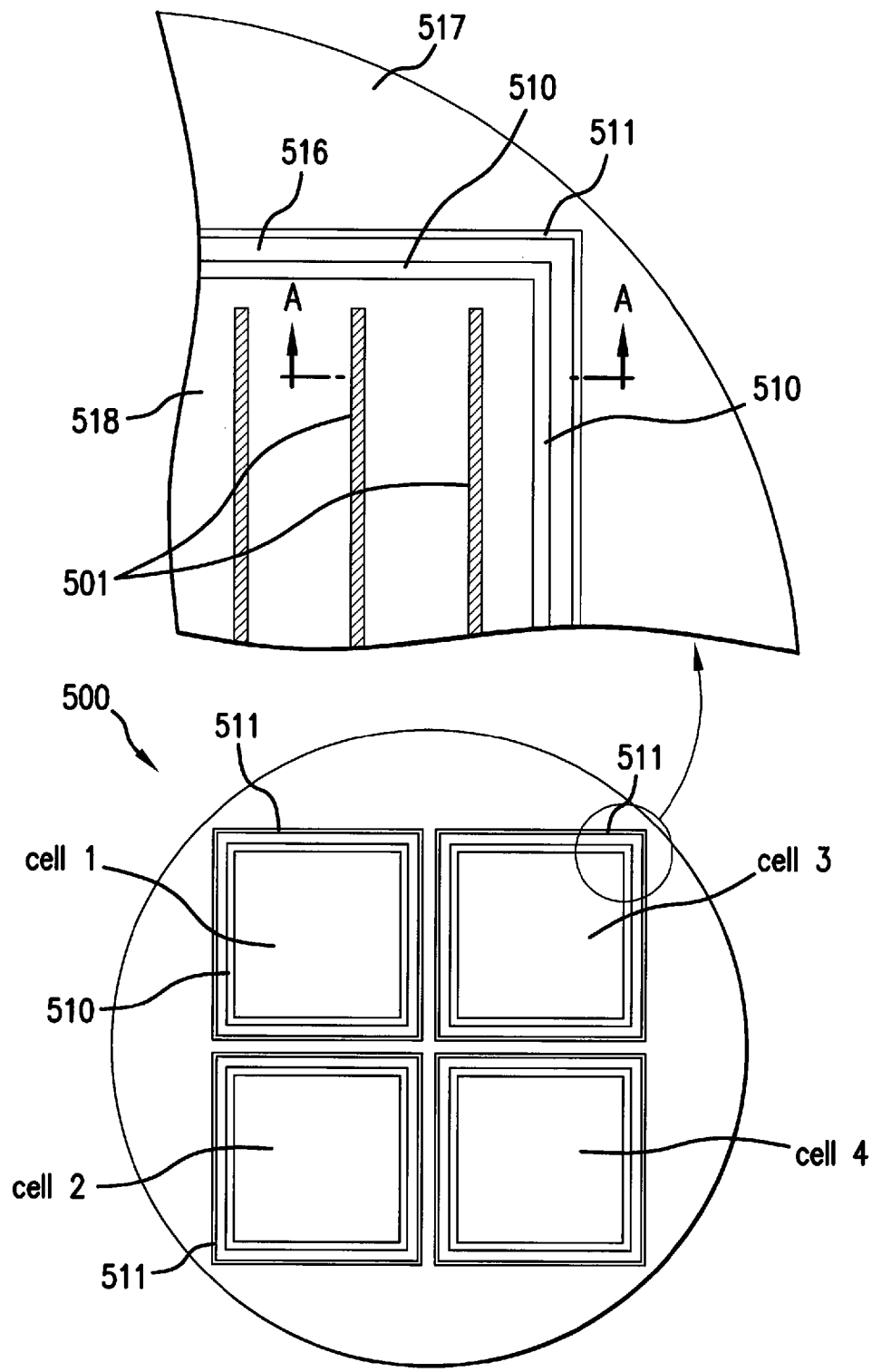
FIG. 13A is a top plan view of the wafer of FIG. 10A depicting the surface view of the trench etched around the cell, after the process step depicted in FIG. 12B.

FIG. 13A is a top plan view of the wafer of FIG. 10A depicting the channels 510 and 511 etched around the periphery of each cell.

Figure 13B:
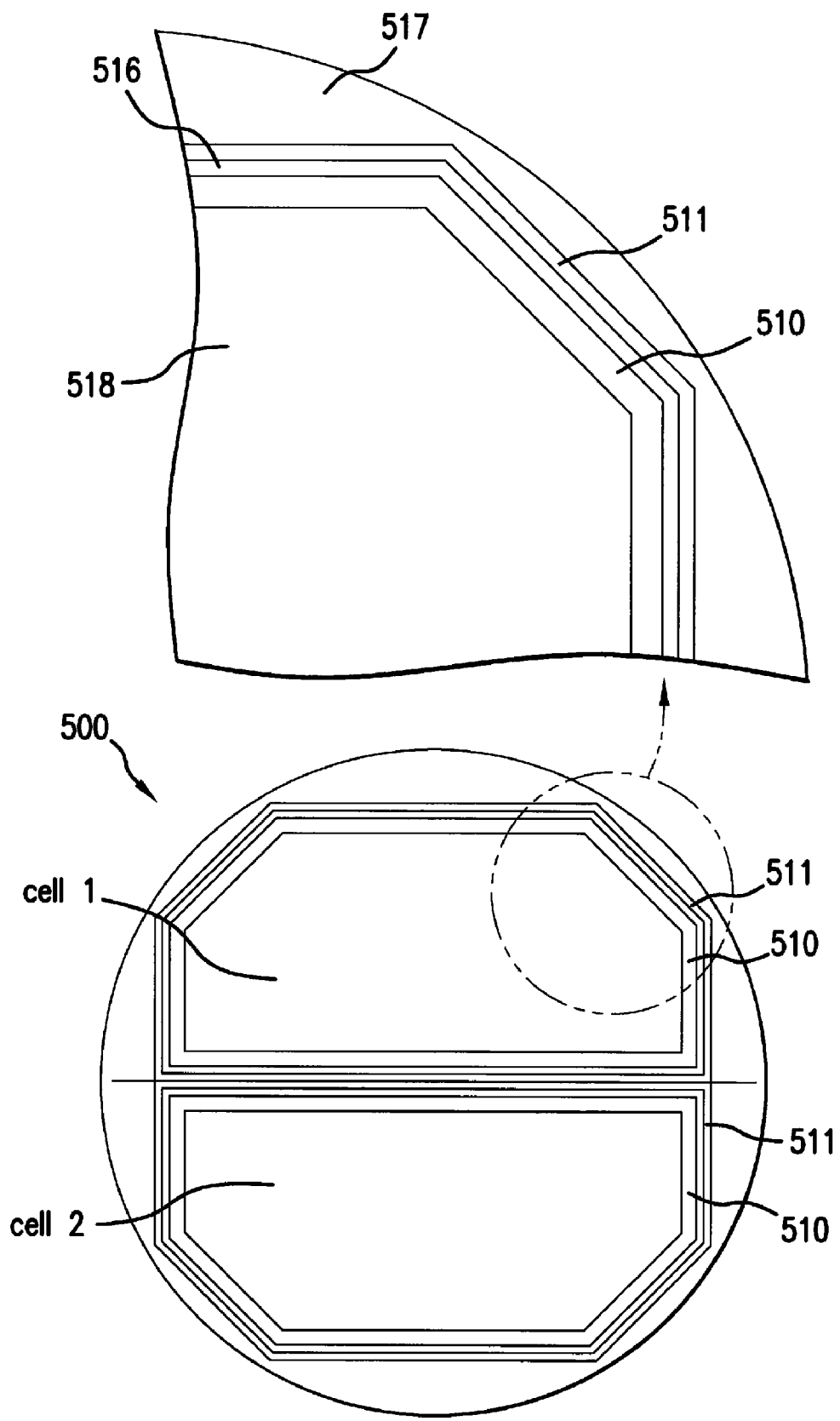
FIG. 13B is a top plan view of the wafer of FIG. 10C depicting the surface view of the trench etched around the cell, after the process step depicted in FIG. 12B.

FIG. 13B is a top plan view of the wafer of FIG. 10C depicting the channels 510 and 511 etched around the periphery of each cell.

Figure 12B:
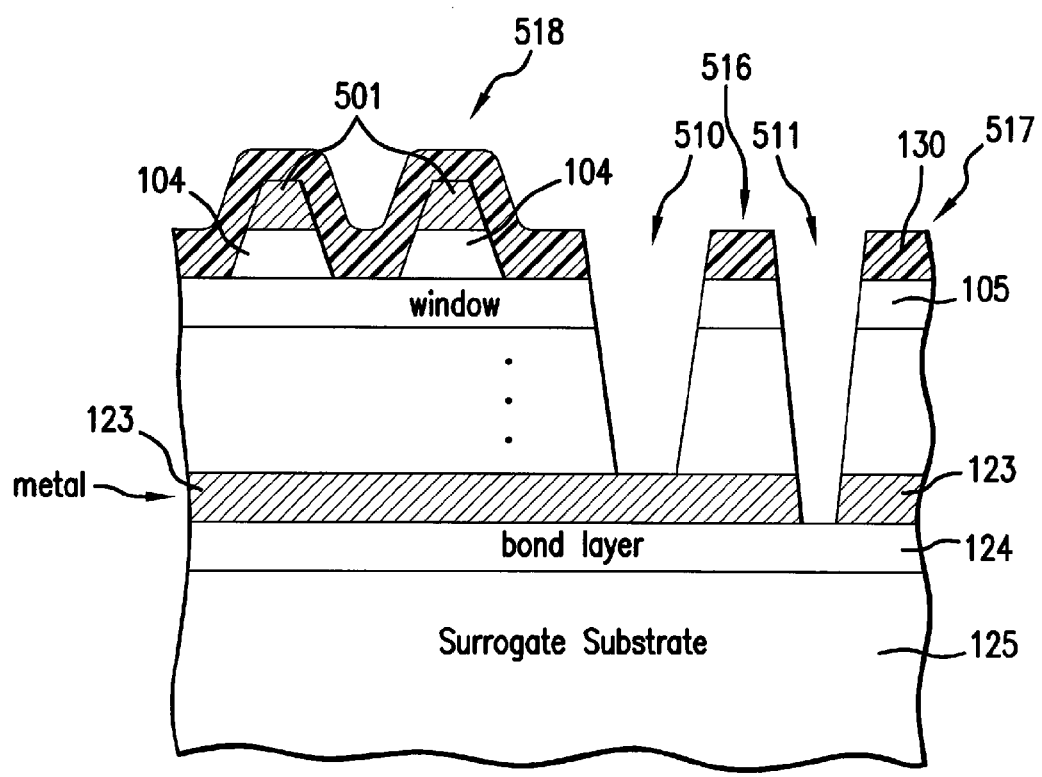
FIG. 12B is a cross-sectional view of the solar cell of FIG. 12A after the next process step.
Figure 14A:
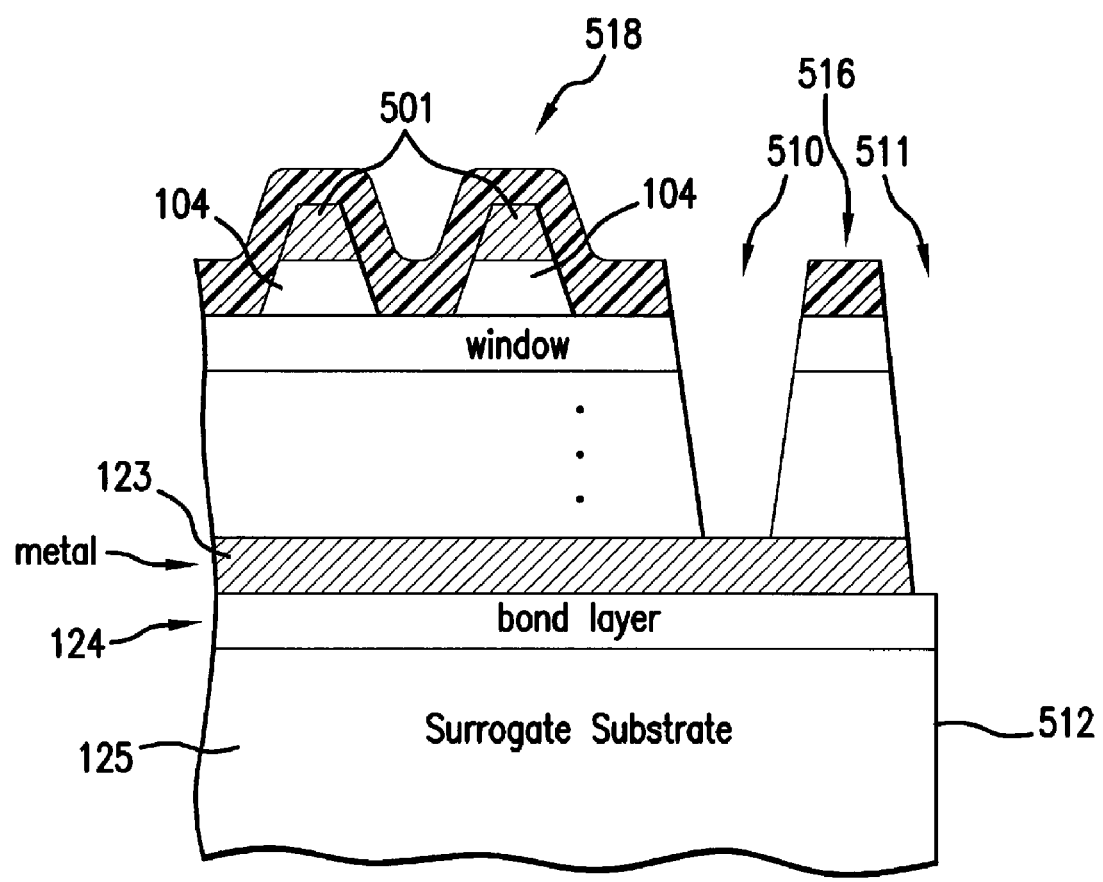
FIG. 14A is a cross-sectional view of the solar cell of FIG. 12B after the next process step in a first embodiment of the present invention.

FIG. 14A is a cross-sectional view of the solar cell of FIG. 12B after the individual solar cells (cell 1, cell 2, etc. shown in FIG. 13) are cut or scribed from the wafer through the channel 511, leaving a vertical edge 512 extending through the surrogate substrate 125. In this first embodiment of the present invention, the surrogate substrate 125 forms the support for the solar cell in applications where a cover glass (such as provided in the third embodiment to be described below) is not required. In such an embodiment, electrical contact to the metal contact layer 123 may be made through the channel 510.

Figure 14B:
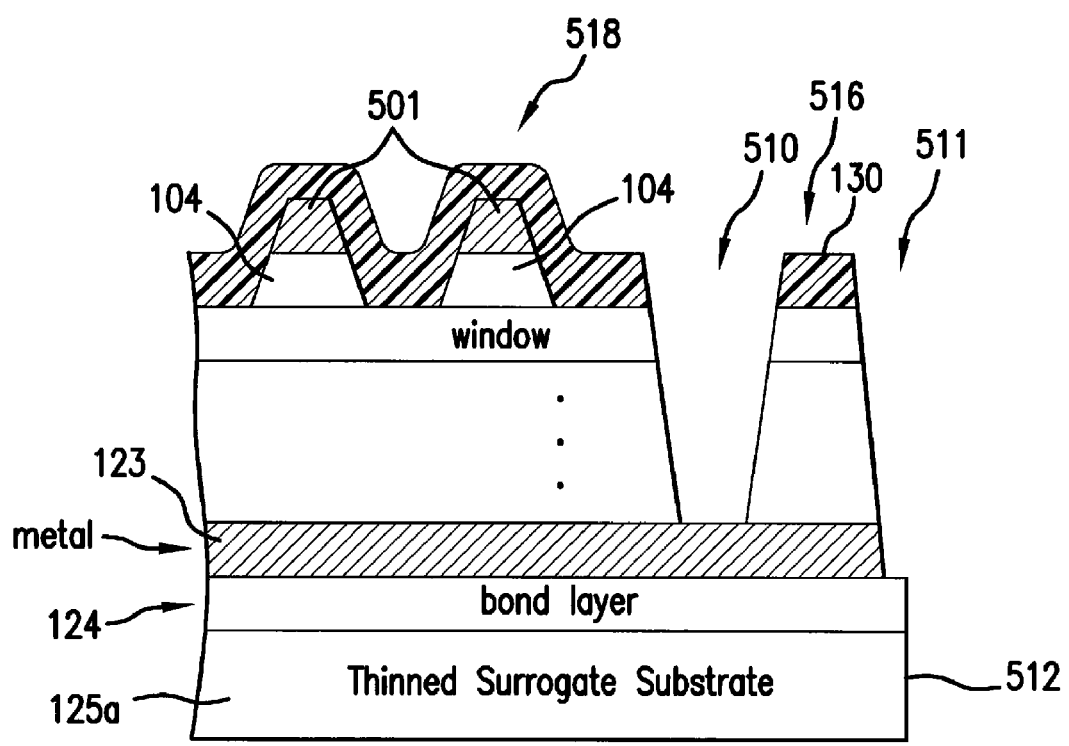
FIG. 14B is a cross-sectional view of the solar cell of FIG. 12B after the next process step in a second embodiment of the present invention.

FIG. 14B is a cross-sectional view of the solar cell of FIG. 12B after the next process step in a second embodiment of the present invention in which the surrogate substrate 125 is appropriately thinned to a relatively thin layer 125a, by grinding, lapping, or etching. In this embodiment, the thin layer 125a forms the support for the solar cell in applications where a cover glass, such as provided in the third embodiment to be described below, is not required. In such an embodiment, electrical contact to the metal contact layer 123 may be made through the channel 510.

Figure 14C:
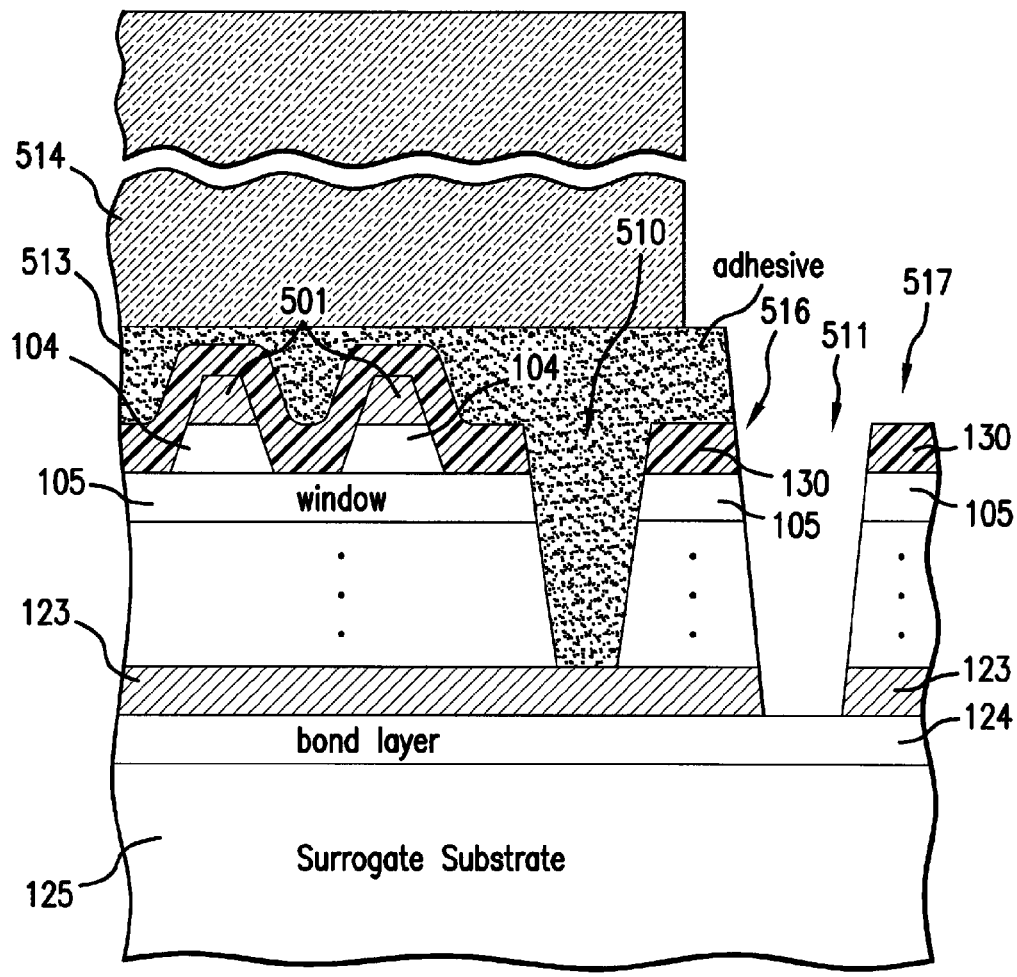
FIG. 14C is a cross-sectional view of the solar cell of FIG. 12B after the next process step in a third embodiment of the present invention.

FIG. 14C is a cross-sectional view of the solar cell of FIG. 12B after the next process step in a third embodiment of the present invention in which a cover glass 514 is secured to the top of the cell by an adhesive 513. The cover glass 514 is typically about 4 mils thick and preferably covers the entire channel 510, extends over a portion of the mesa 516, but does not extend to channel 511. Although the use of a cover glass is desirable for many environmental conditions and applications, it is not necessary for all implementations, and additional layers or structures may also be utilized for providing additional support or environmental protection to the solar cell.

Figure 14D:
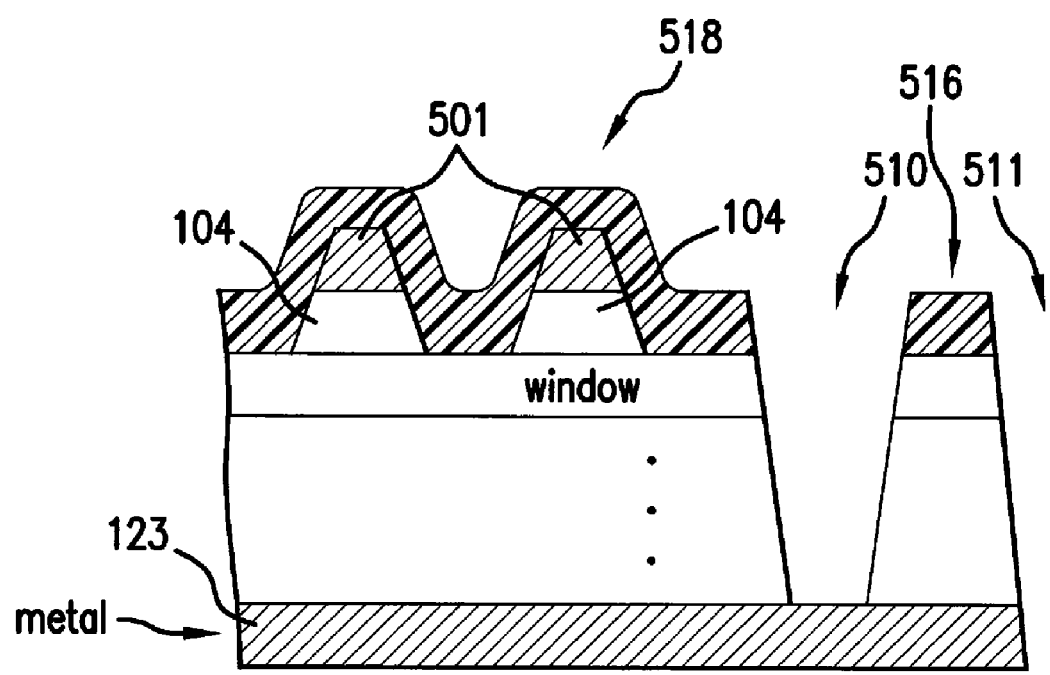
FIG. 14D is a cross-sectional view of the solar cell of FIG. 14A after the next process step of removal of the surrogate substrate.

FIG. 14D is a cross-sectional view of the solar cell of FIG. 14A after the next process step in some embodiments of the present invention in which the adhesive layer 124, the surrogate substrate 125 and the peripheral portion 517 of the wafer is entirely removed, leaving only the solar cell with the ARC layer 130 (or other layers or structures) on the top, and the metal contact layer 123 on the bottom, which forms the back-side contact of the solar cell. The surrogate substrate is preferably removed by the use of a 'Wafer Bond' solvent. As noted above, the surrogate substrate includes perforations over its surface that allow the flow of solvent through the surrogate substrate 125 to permit its lift off. After lift off, the surrogate substrate may be reused in subsequent wafer processing operations.

Figure 15:
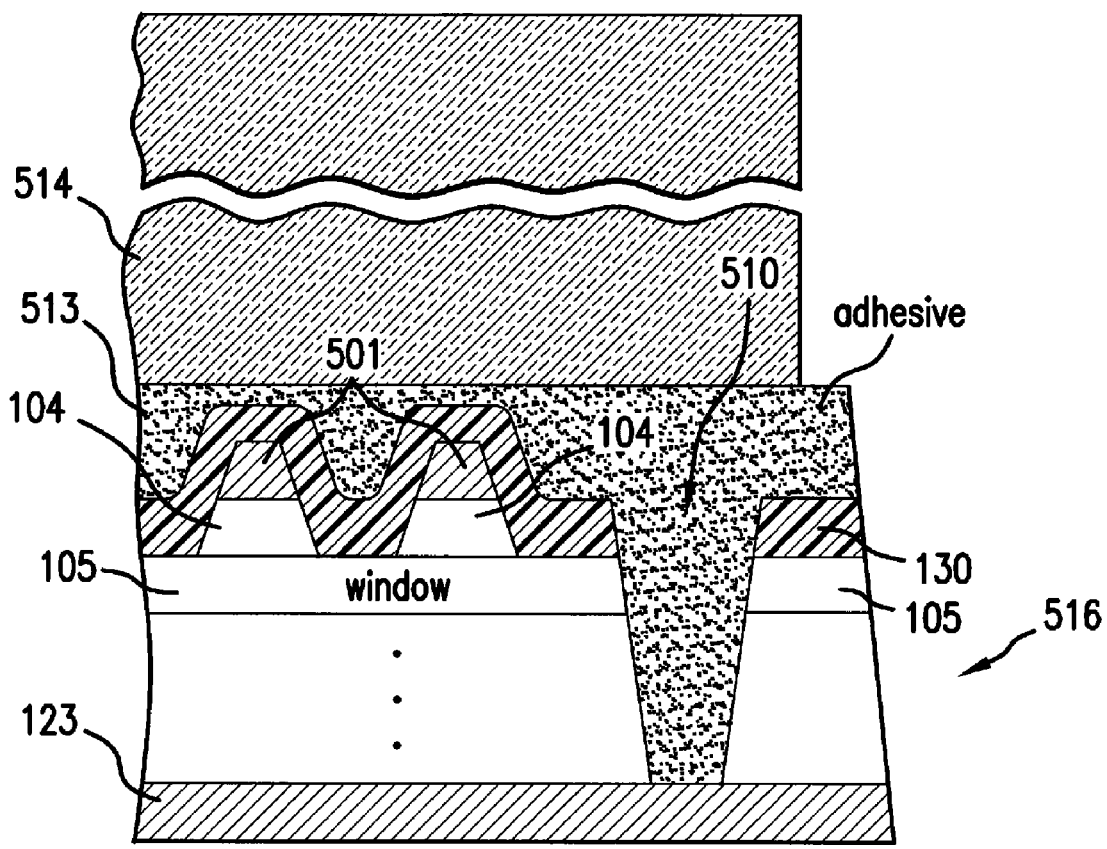
FIG. 15 is a cross-sectional view of the solar cell of FIG. 14B after the next process step in a third embodiment of the present invention.

FIG. 15 is a cross-sectional view of the solar cell of FIG. 14C after the next process step in some embodiments of the present invention in which the adhesive layer 124, the surrogate substrate 125 and the peripheral portion 517 of the wafer is entirely removed, leaving only the solar cell with the cover glass 514 (or other layers or structures) on the top, and the metal contact layer 123 on the bottom, which forms the back-side contact of the solar cell. The surrogate substrate is preferably removed by the use of a 'Wafer Bond' solvent. As noted above, the surrogate substrate includes perforations over its surface that allow the flow of solvent through the surrogate substrate 125 to permit its lift off. After lift off, the surrogate substrate may be reused in subsequent wafer processing operations.

Figure 16:
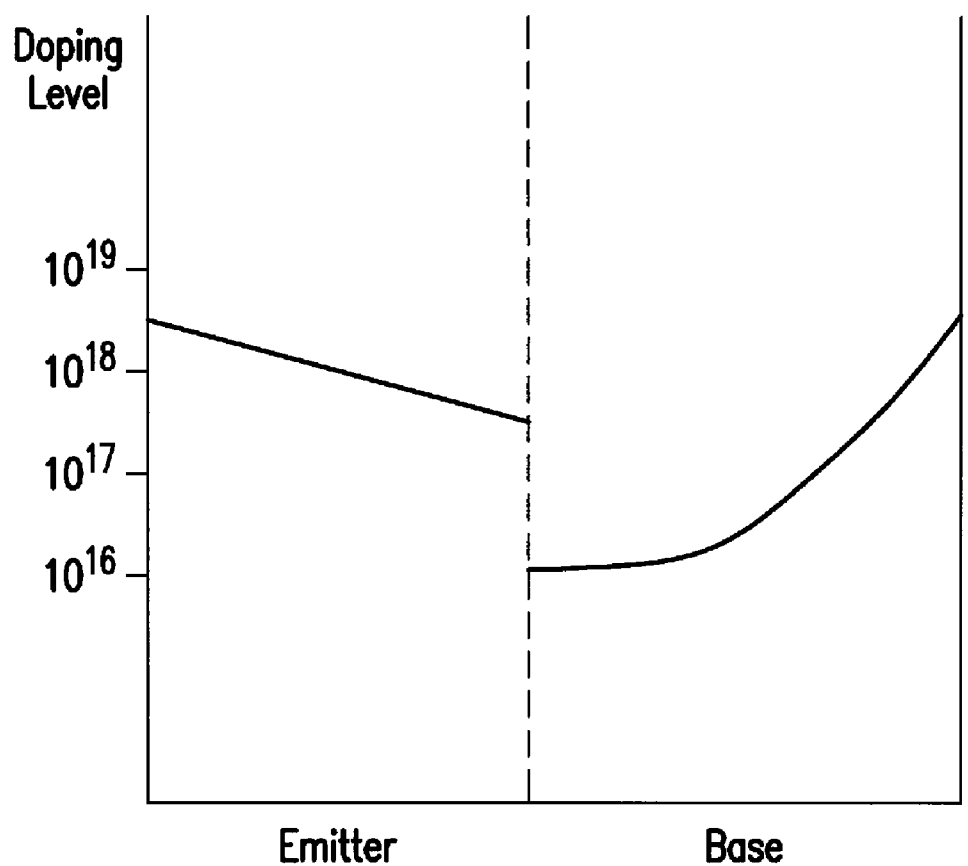
FIG. 16 is a graph of the doping profile in the base and emitter layers of a subcell in the metamorphic solar cell according to the present invention.

FIG. 16 is a graph of a doping profile in the emitter and base layers in one or more subcells of the inverted metamorphic multijunction solar cell of the present invention. The various doping profiles within the scope of the present invention, and the advantages of such doping profiles are more particularly described in copending U.S. patent application Ser. No. 11/956,069 filed Dec. 13, 2007, herein incorporated by reference. The doping profiles depicted herein are merely illustrative, and other more complex profiles may be utilized as would be apparent to those skilled in the art without departing from the scope of the present invention.

Figure 17:
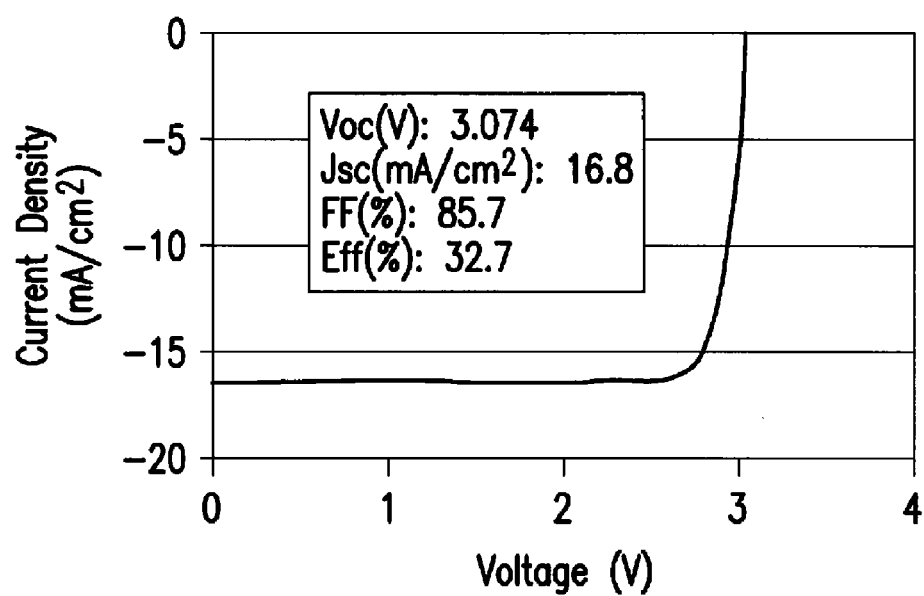
FIG. 17 is a graph that depicts the current and voltage characteristics of an inverted metamorphic multijunction solar cell according to the present invention.

FIG. 17 is a graph that depicts the current and voltage characteristics of the solar cell according to the present invention. The solar cell has an open circuit voltage ($V_{oc}$) of approximately 3.074 volts, a short circuit current of approximately 16.8 mA/cm$^2$, a fill factor of approximately 85.7%, and an efficiency (at AM0) of 32.7%.

Figure 18A:
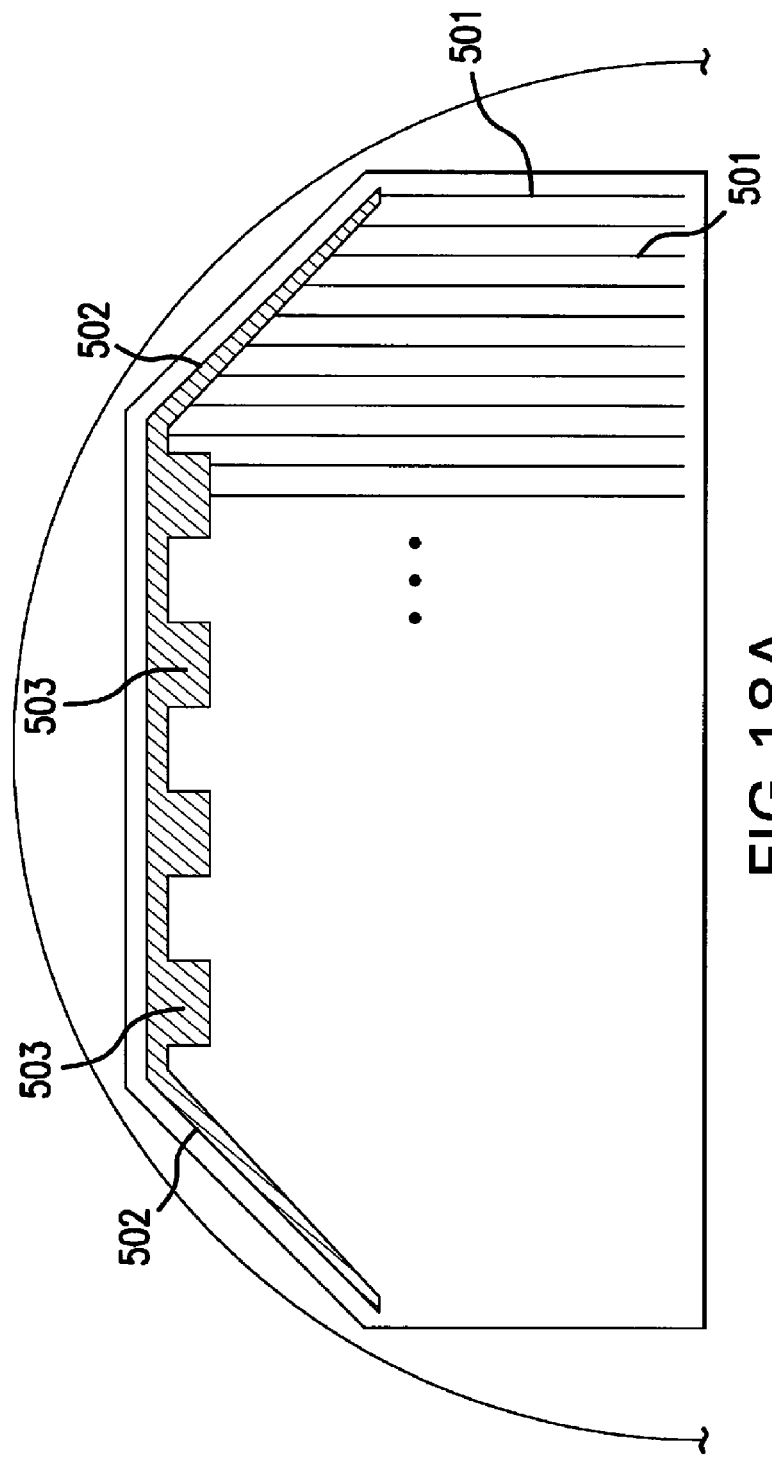
FIG. 18A is a top plan view of a solar cell derived from the wafer of FIG. 11 depicting the formation of the top contact pads and bus bar.

FIG. 18A is a top plan view of a portion of the wafer depicted in FIG. 10C showing a solar cell following the process steps depicted in FIG. 11. As depicted in the Figure, in each solar cell there are grid lines 501 (more particularly shown in cross-section in FIG. 9), an interconnecting bus line 502, and contact pads 503. The geometry and number of grid and bus lines and contact pads are illustrative, and the present invention is not limited to the illustrated embodiment.

Figure 18B:
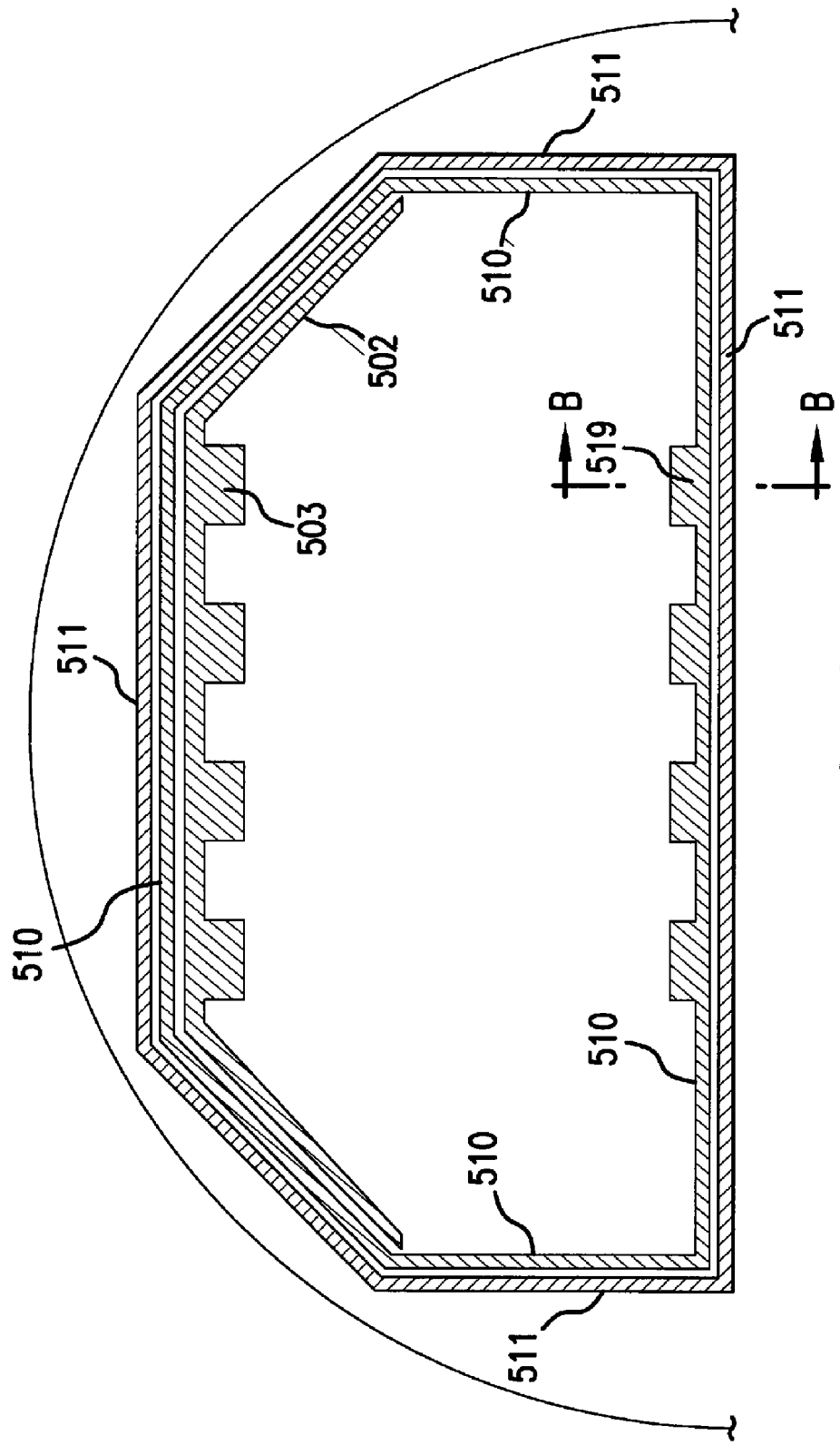
FIG. 18B is a top plan view of a solar cell of FIG. 18A after etching the vias to the back metal layer.

FIG. 18B is a top plan view of a portion of the wafer depicted in FIG. 18A after the processes depicted in FIG. 12A have been performed, depicting both the vias 519 to the back metal layer 123, as well as the circumferential mesa channel 511, with the metal being depicted at 519 and 511 being the back metal layer 123. The grid lines 501, shown in FIG. 18A, are not depicted to simplify the drawing.

Figure 18C:
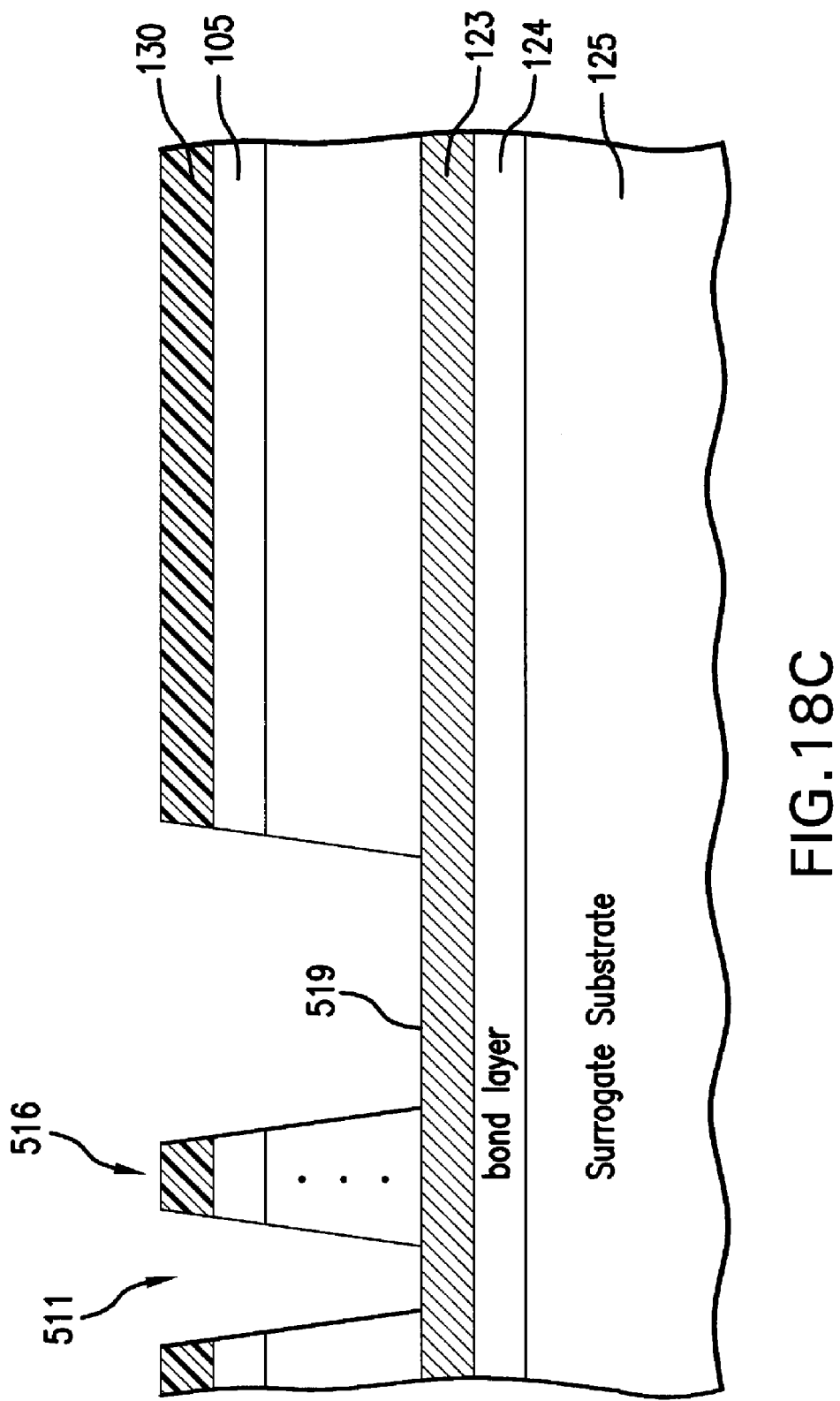
FIG. 18C is a cross sectional view of a portion of the wafer depicted in FIG. 18B through the B-B plane, after the process depicted in FIG. 12A.

FIG. 18C is a cross sectional view of a portion of the wafer depicted in FIG. 18B through the B-B plane, after the processes depicted in FIG. 12A have been performed, in particular showing one of the contact pads 519 formed at the back metal layer 123, as well as the circumferential mesa channel 511 extending to the level of the back metal layer 123.

Figure 18D:
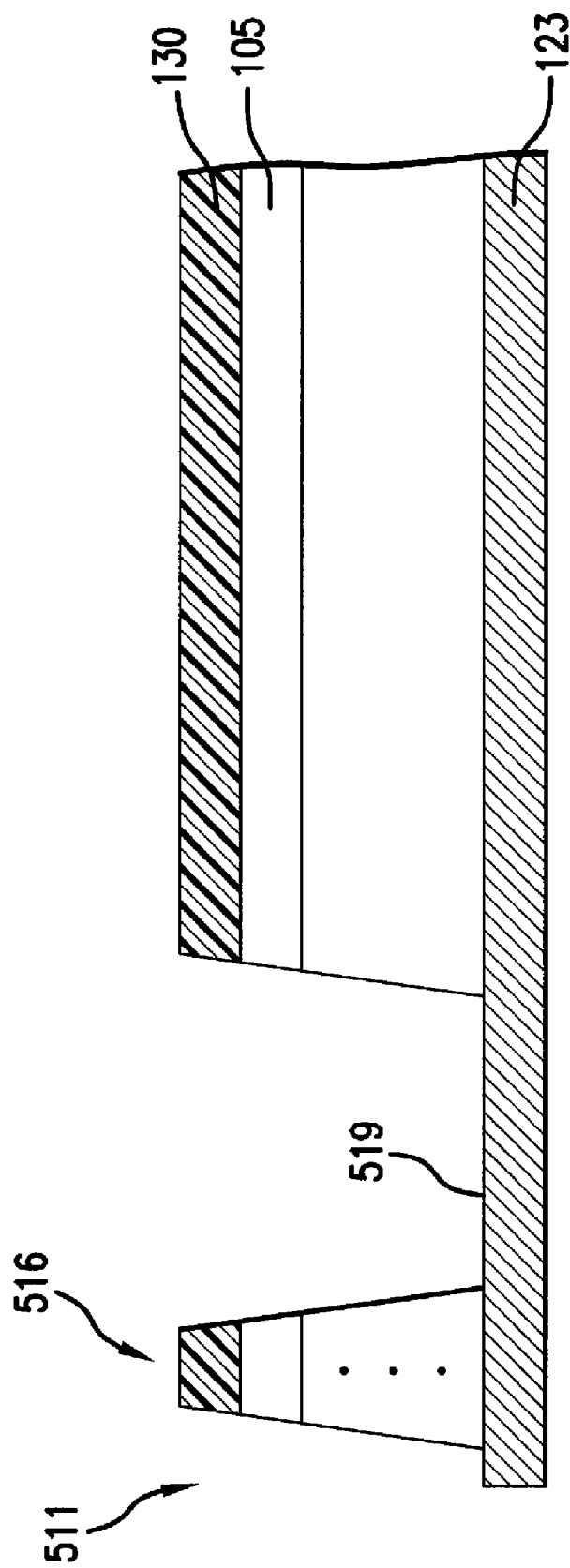
FIG. 18D is a cross sectional view of the solar cell of FIG. 18B through the B-B plane after being separated from the wafer.

FIG. 18D is a cross sectional view of a solar cell of FIG. 18B through the B-B plane, after having been cut from the wafer through the channel 511, leaving a vertical edge 512 extending through the surrogate substrate 125.

Figure 19A:
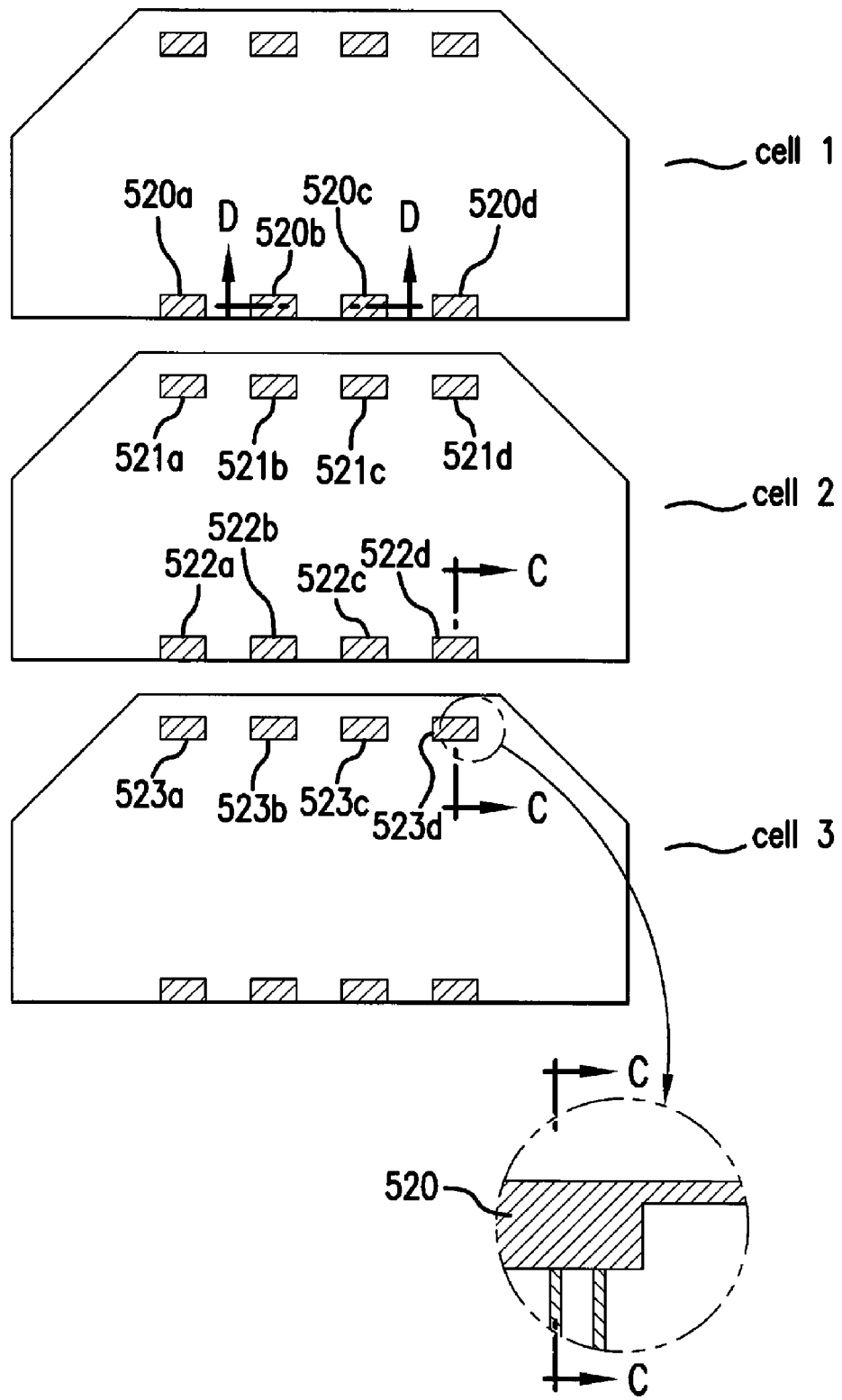
FIG. 19A is a top plan view of a string of three solar cells after being separated from the wafer after the cut through the channel 511 as illustrated in FIG. 14A.

FIG. 19A is a top plan view of a string of three solar cells after the solar cells have been separated from the wafer (after the cut through the channel 511) and separated from the surrogate substrate, as illustrated in FIG. 14D, with the three solar cells being positioned and aligned on the surface of a vacuum block to be fabricated into a finished interconnected string according to the present invention. The bottom contact pads 520a, 520b, 520c, and 520d of cell 1 are depicted as being adjacent to and aligned with the top contacts 521a, 521b, 521c, and 522d, respectively, of cell 2. The bottom contact pads 522a, 522b, 522c, and 522d of cell 2 are depicted as being adjacent to and aligned with the top contacts 523a, 523b, 523c, and 523d, respectively, of cell 3. The cross sectional view of cells 2 and 3, through the C-C plane indicated in the Figure, is depicted in FIG. 19C. The cross sectional view of cell 1, through the D-D plane indicated in the Figure, is depicted in FIG. 19B.

Figure 19B:
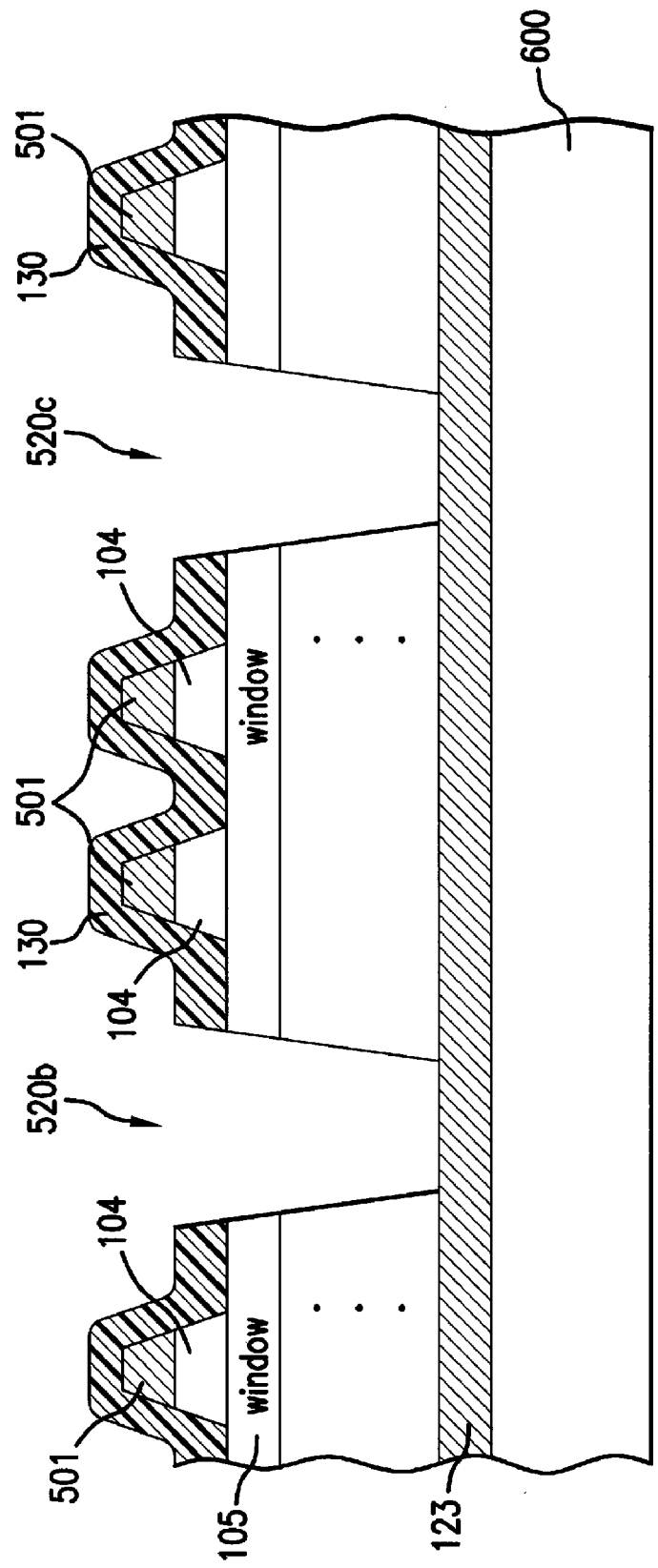
FIG. 19B is a cross sectional view of a portion of cell 1 of the string of three solar cells illustrated in FIG. 19A through the D-D plane of FIG. 19A.
Figure 19C:
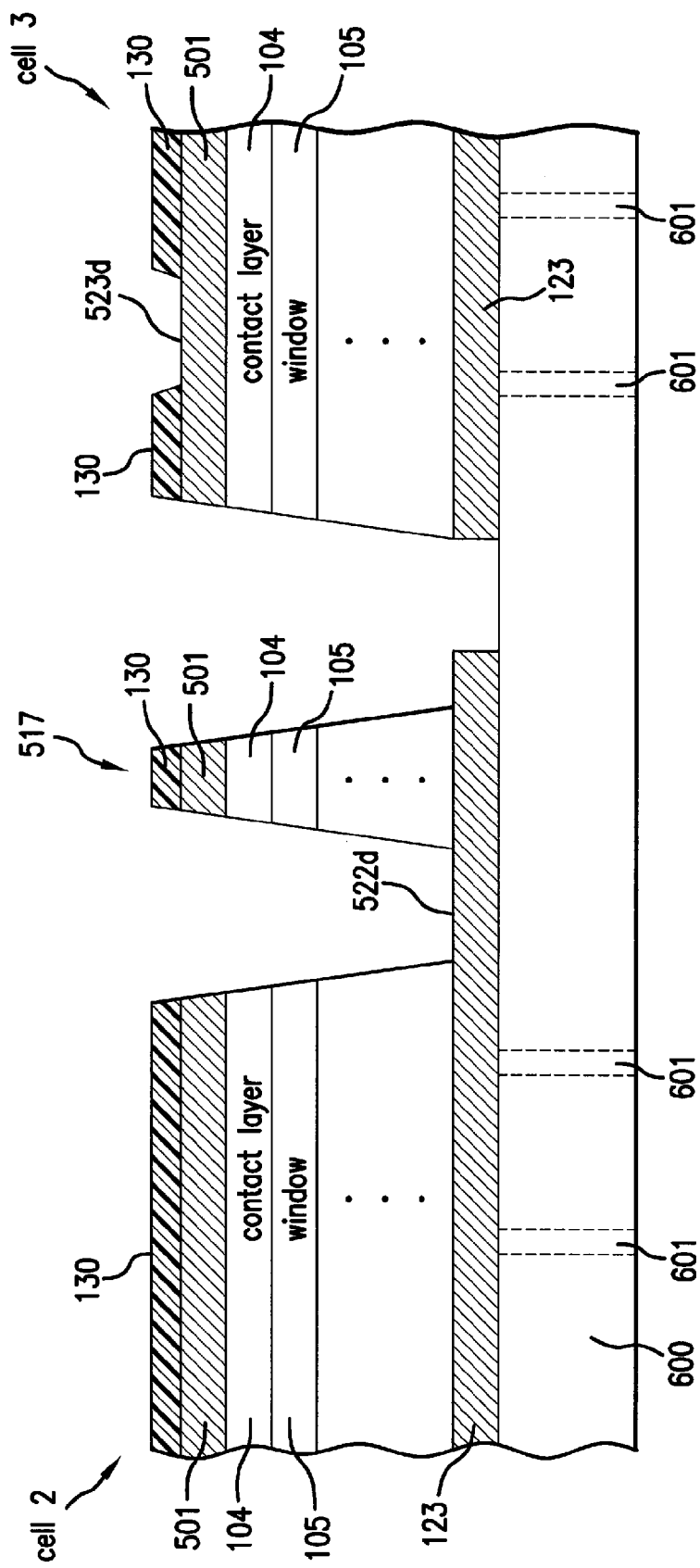
FIG. 19C is a cross sectional view of a portion of cells 2 and 3 of the string of three solar cells illustrated in FIG. 19A through the C-C plane of FIG. 19A.

FIG. 19B is a cross sectional view of a portion of cell 1 of the string of three solar cells illustrated in FIG. 19A through the D-D plane of FIG. 19A. The bottom contact pads 520b and 520c are illustrated.

FIG. 19C is a cross sectional view of a portion of cells 2 and 3 of the string of three solar cells illustrated in FIG. 19A through the E-E plane of FIG. 19A with the two cells being supported on a vacuum block 600 prior to interconnection. The vacuum block 600 includes holes 601 extending through its thickness to which a small vacuum is applied to secure the cells to the vacuum block during subsequent fabrication steps. The bottom contact pad 522d and the top contact pad 523d are illustrated.

Figure 20A:
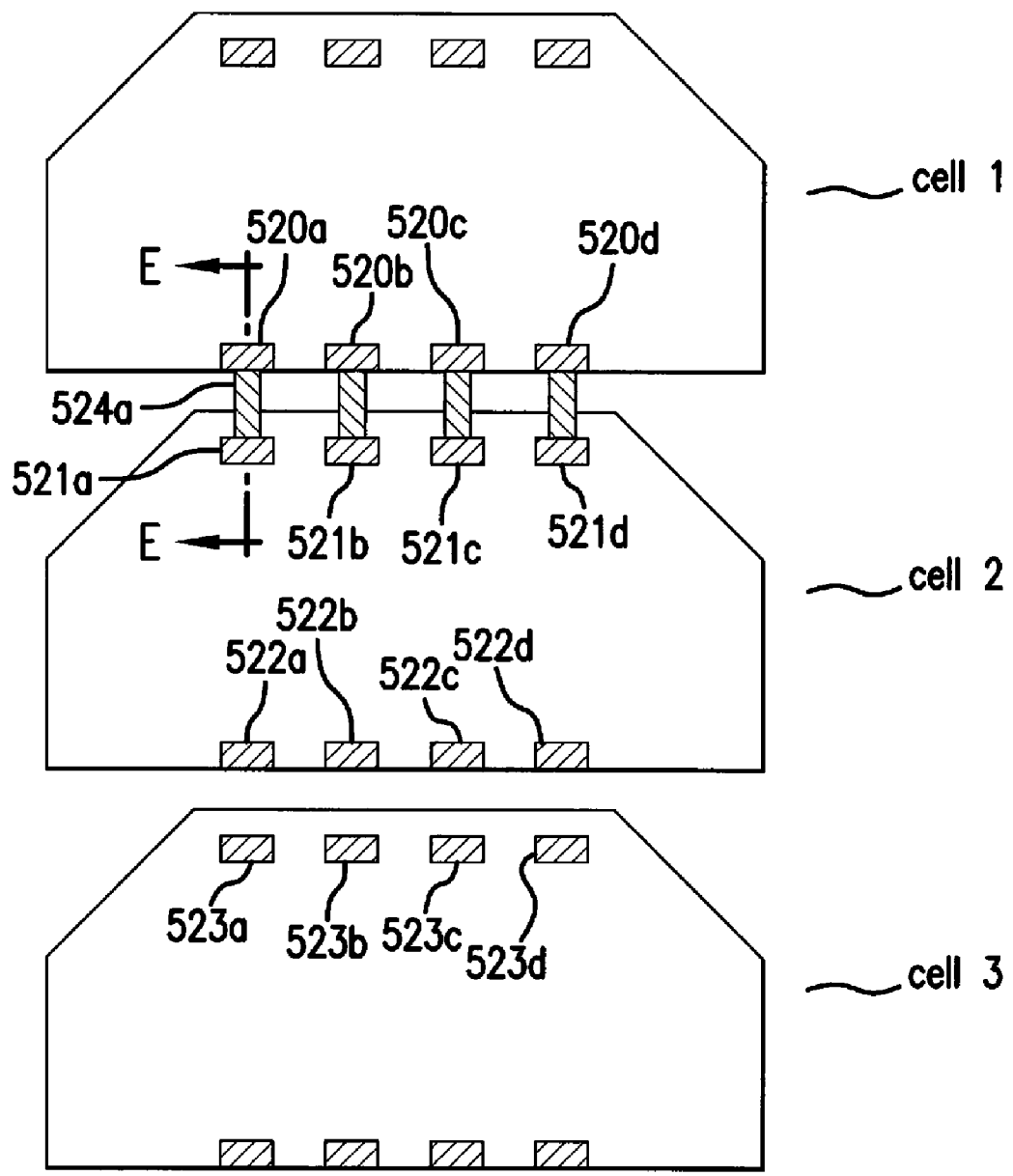
FIG. 20A is a top plan view of a string of three solar cells of FIG. 19A after interconnections of cell 1 and cell 2 are welded.

FIG. 20A is a top plan view of a string of three solar cells of FIG. 19A after interconnections 524a, 524b, 524c, and 524d are welded between the bottom contacts 520a, 520b, 520c, and 520d of cell 1 and the top contacts 521a, 521b, 521c, and 522d, respectively, of cell 2. Subsequently to such welding, although not depicted in the Figure, interconnections between the bottom contacts 522a, 522b, 522c, and 522d of cell 2 will be welded to the top contacts 523a, 523b, 523c, and 523d, respectively, of cell 3. The cross sectional view of cells 1 and 2, through the E-E plane indicated in the Figure, showing the interconnect 524a, is depicted in FIG. 20B.

Figure 20B:
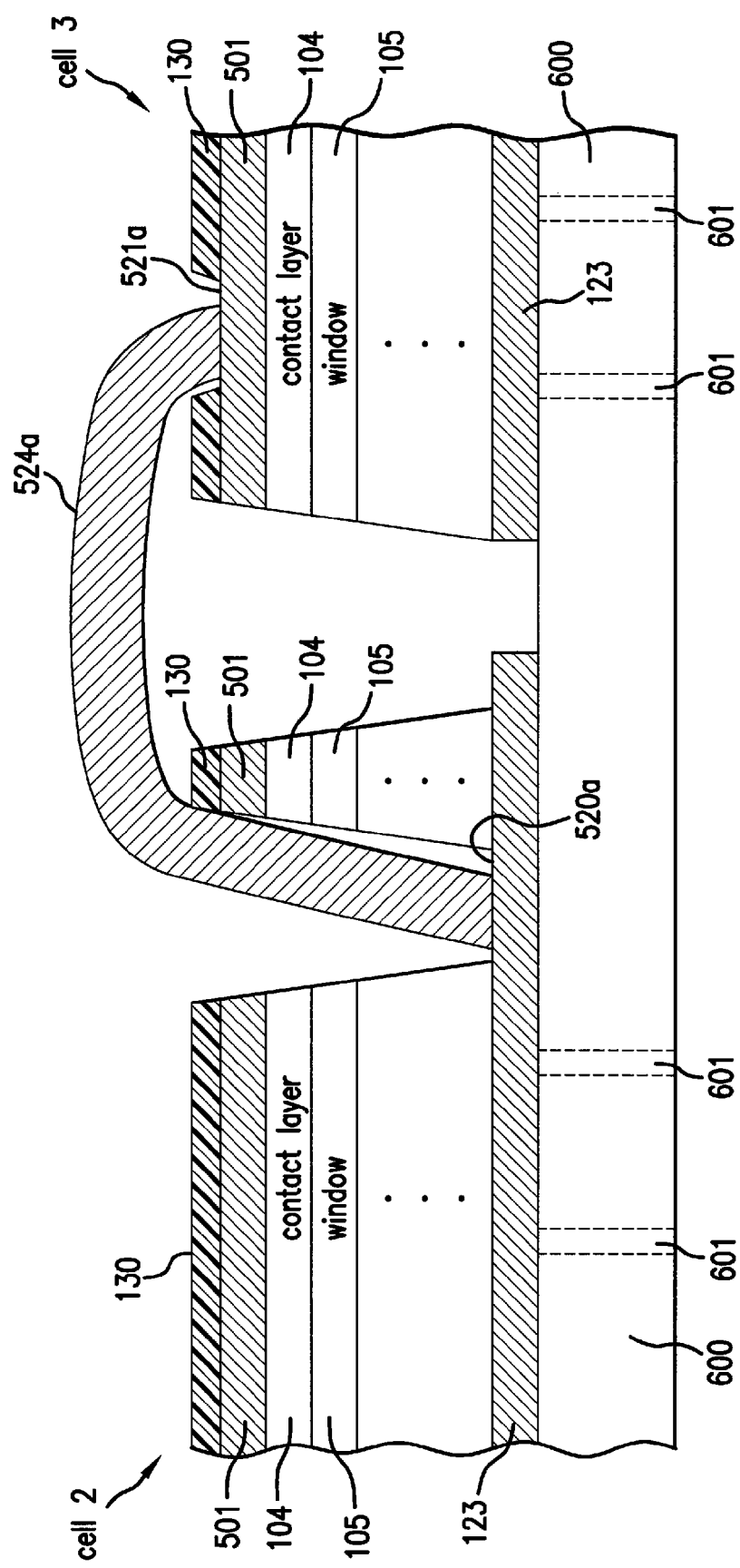
FIG. 20B is a cross-sectional view of two of the solar cells depicted in FIG. 20A as seen through the E-E plane of FIG. 20A.

FIG. 20B is a cross-sectional view of two of the solar cells (cell 1 and cell 2) depicted in FIG. 20A as seen from the F-F plane indicated in FIG. 20A, with the two cells being supported on a vacuum block 600 prior to interconnection. The vacuum block 600 includes holes 601 extending through its thickness to which a small vacuum is applied to secure the cells to the vacuum block during subsequent fabrication steps.

FIG. 20B is a cross-sectional view of two of the solar cells (cell 1 and cell 2) depicted in FIG. 20A as seen from the E-E plane indicated in FIG. 20A, with the two cells being supported on a vacuum block 600 following the welding on the interconnection 524a between contacts 520a and 521a.

Figure 21:
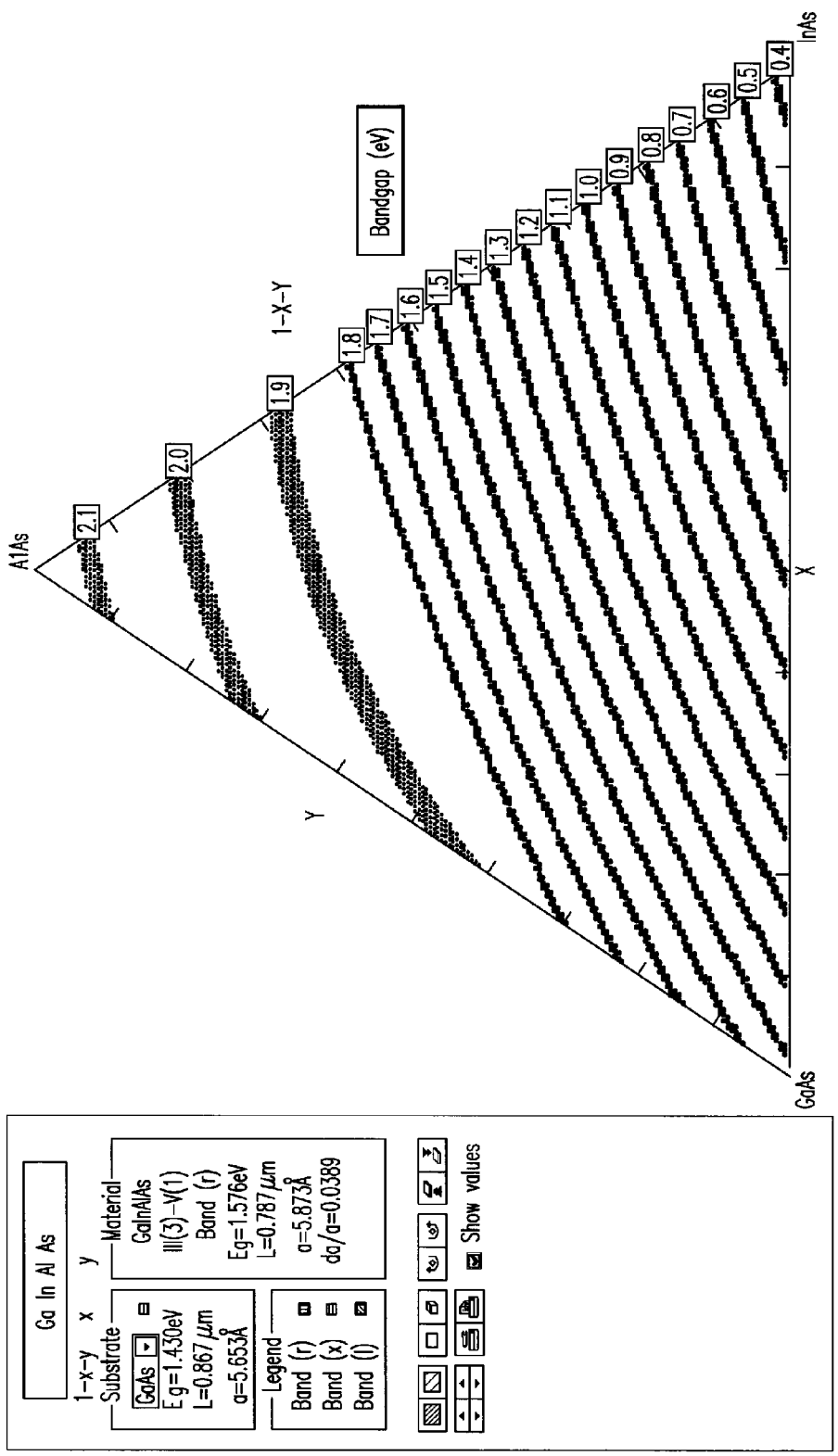
FIG. 21 is a diagram representing the range of band gaps of various GaInAlAs materials as a function of the relative concentration of Al, In, and Ga.

FIG. 21 is a diagram representing the range of band gaps of various GaInAlAs materials as a function of the relative concentration of Al, In, and Ga. This diagram illustrates how the selection of a constant band gap sequence of layers of GaInAlAs used in the metamorphic layer may be designed through the appropriate selection of the relative concentration of Al, In, and Ga to meet the different lattice constant requirements for each successive layer. Thus, whether 1.5 eV or 1.1 eV or other band gap value is the desired constant band gap, the diagram illustrates a continuous curve for each band gap, representing the incremental changes in constituent proportions as the lattice constant changes, in order for the layer to have the required band gap and lattice constant.

Figure 22:
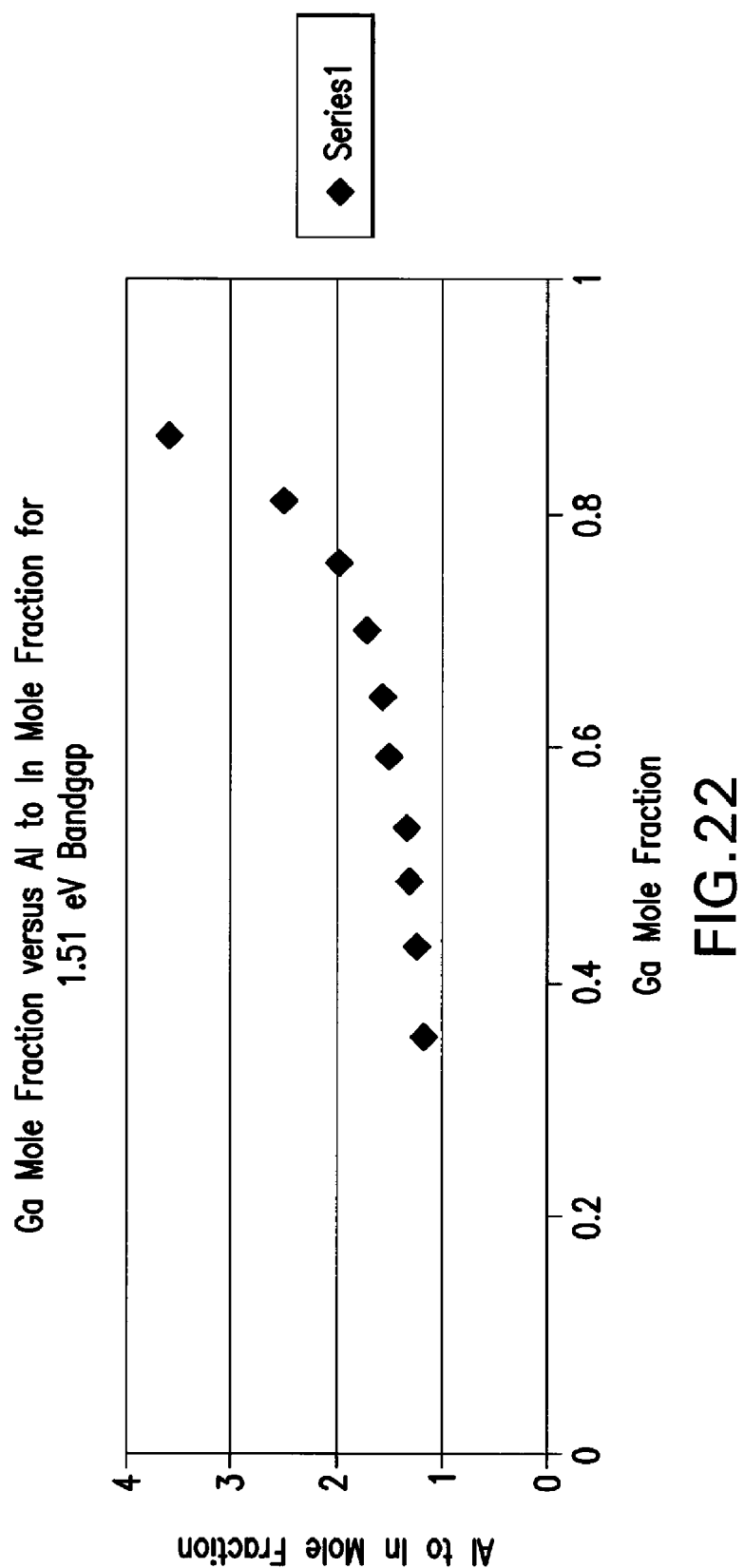
FIG. 22 is a graph representing the Ga mole fraction versus the Al to In mole fraction in GaInAlAs materials that is necessary to achieve a constant 1.5 eV band gap.

FIG. 22 is a graph that further illustrates the selection of a constant band gap sequence of layers of GaInAlAs used in the metamorphic layer by representing the Ga mole fraction versus the Al to In mole fraction in GaInAlAs materials that is necessary to achieve a constant 1.5 eV band gap.

Figure 23:
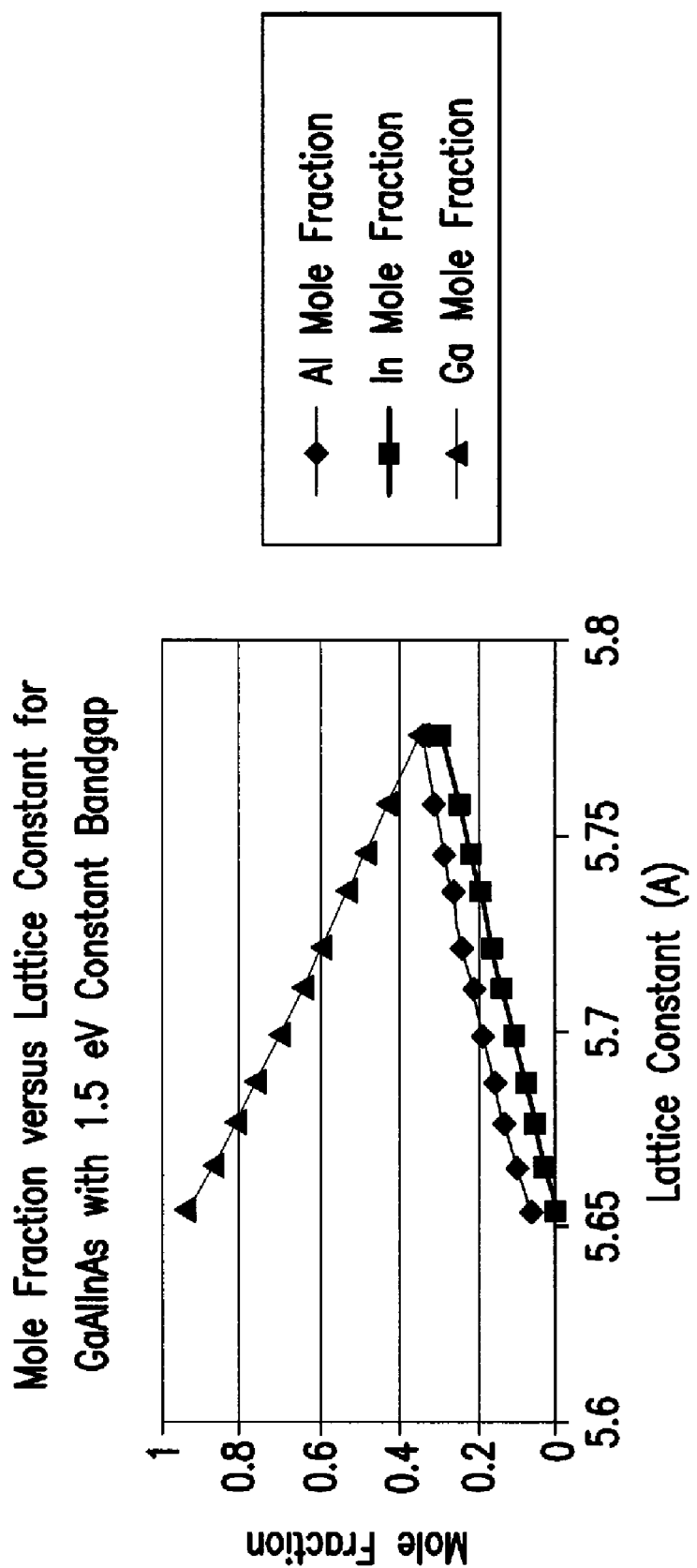
FIG. 23 is a graph representing the mole fraction versus lattice constant in GaInAlAs materials that is necessary to achieve a constant 1.5 eV band gap.

FIG. 23 is a graph that further illustrates the selection of a constant band gap sequence of layers of GaInAlAs used in the metamorphic layer by representing the mole fraction versus lattice constant in GaInAlAs materials that is necessary to achieve a constant 1.5 eV band gap.

It will be understood that each of the elements described above, or two or more together, also may find a useful application in other types of constructions differing from the types of constructions described above.

Although one embodiment of the present invention utilizes a vertical stack of three subcells, the present invention can apply to stacks with fewer or greater number of subcells, i.e. two junction cells, four junction cells, five junction cells, etc. as more particularly described in U.S. patent application Ser. No. 12/267,812 filed Nov. 10, 2008. In the case of four or more junction cells, the use of more than one metamorphic grading interlayer may also be utilized, as more particularly described in U.S. patent application Ser. No. 12/271,192 filed Nov. 14, 2008.

In addition, although the present embodiment is configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the present invention may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell A, with p-type and n-type InGaP is one example of a homojunction subcell. Alternatively, as more particularly described in U.S. patent application Ser. No. 12/023,772, filed Jan. 31, 2008, the present invention may utilize one or more, or all, heterojunction cells or subcells, i.e., a cell or subcell in which the p-n junction is formed between a p-type semiconductor and an n-type semiconductor having different chemical compositions of the semiconductor material in the n-type regions, and/or different band gap energies in the p-type regions, in addition to utilizing different dopant species and type in the p-type and n-type regions that form the p-n junction.

In some cells, a thin so-called "intrinsic layer" may be placed between the emitter layer and base layer, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness. Some such configurations are more particularly described in copending U.S. patent application Ser. No. 12/253,051, filed Oct. 16, 2008.

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the invention has been illustrated and described as embodied in an inverted metamorphic multijunction solar cell, it is not intended to be limited to the details shown, since various modifications and structural changes may be made without departing in any way from the spirit of the present invention.

Thus, while the description of this invention has focused primarily on solar cells or photovoltaic devices, persons skilled in the art know that other optoelectronic devices, such as thermophotovoltaic (TPV) cells, photodetectors and light-emitting diodes (LEDS), are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, from the foregoing others can, by applying current knowledge, readily adapt the present invention for various applications. Such adaptations should and are intended to be comprehended within the meaning and range of equivalence of the following claims.

The invention claimed is:

1. A method of forming a multijunction solar cell comprising an upper subcell, a middle subcell, and a lower subcell comprising:
   providing a first substrate for the epitaxial growth of semiconductor material;
   forming an upper first solar subcell on said first substrate having a first band gap;
   forming a middle second solar subcell over said upper first solar subcell having a second band gap smaller than said first band gap;
   forming a graded interlayer over said middle second solar subcell;
   forming a lower third solar subcell over said graded interlayer having a fourth band gap smaller than said second band gap such that said lower third solar subcell is lattice mismatched with respect to said middle second solar subcell;
   forming a metal contact layer over said lower third solar subcell;
   attaching a surrogate second substrate over said metal contact layer and removing said first substrate; and
   etching a first trough around the periphery of said multijunction solar cell through the solar subcells and said graded interlayer to the metal contact layer so as to form a mesa structure on said surrogate second substrate to form a plurality of contact pads on said metal contact layer, said plurality of contact pads spaced apart along said metal contact layer by intermediate sections, said contact pads having a larger surface area than an adjacent one of said intermediate sections.

2. The method as defined in claim 1, further comprising etching a second trough around the periphery of said multijunction solar cell simultaneously with the etching of the first trough, wherein the second trough lies outside the periphery of the first trough.

3. The method as defined in claim 2, further comprising subsequently etching the second trough to the surface of the surrogate second substrate to facilitate the removal of the multijunction solar cell from the surrogate second substrate.

4. The method as defined in claim 1, wherein said plurality of contact pads are located along an edge of said multijunction solar cell, wherein each of said intermediate sections extend inwardly away from the edge of the multijunction solar cell at the metal contact layer a first distance, and wherein each of said contact pads extend inwardly away from the edge of the multijunction solar cell at the metal contact layer a second distance greater than the first distance.

5. The method as defined in claim 1, wherein the metal contact layer is a sequence of layers including Ti/Au/Ag/Au.

6. The method as defined in claim 1, further comprising welding one end of a metal interconnect to at least one of the plurality of contact pads.

7. The method as defined in claim 6, further comprising mounting a cover glass over said upper first solar subcell and said interconnect, said cover glass extending over said first trough around the periphery of the multijunction solar cell.

8. The method as defined in claim 7, further comprising mounting the multijunction solar cell on a vacuum chuck adjacent a second multijunction solar cell so that the contact pad of the multijunction solar cell located at a bottom of the multijunction solar cell is adjacent to and aligned with a top contact pad of the second multijunction solar cell.

9. The method as defined in claim 8, further comprising electrically interconnecting the contact pad of the multijunction solar cell with the top contact pad of the second multijunction solar cell by welding a second end of said metal interconnect to the top contact pad of the second multijunction solar cell.

10. A method of manufacturing a solar cell array comprising:
   providing a first substrate;
   depositing on a first substrate a sequence of layers of semiconductor material forming a solar cell including at least a top subcell and a bottom subcell;
   forming a metal contact layer on top of the sequence of layers of semiconductor material;
   mounting a surrogate substrate on top of the metal contact layer;
   removing the first substrate to expose the surface of the top subcell;
   etching a trough around the periphery of said multijunction solar cell through the top and bottom subcells to the metal contact layer to form a plurality of bottom contact pads on the metal contact layer that are spaced apart by intermediate sections on the metal contact layer, said bottom contact pads extending a greater distance inward away from an edge of the metal contact layer towards a center of the multijunction solar cell than said intermediate sections;
   removing the surrogate substrate; and
   holding the solar cell in a vacuum chuck to support it for subsequent fabrication operations.

11. A method as defined in claim 10 further comprising assembling a plurality of solar cells on the vacuum chuck.

12. A method as defined in claim 11, further comprising attaching interconnects to the plurality of bottom contact pads on each of the solar cells.

13. A method as defined in claim 12, further comprising attaching the interconnects from the plurality of bottom contact pads of one solar cell to respective electrodes on an adjacent solar cell.

14. A method as defined in claim 13, further comprising attaching a cover glass to said solar cell.

15. A method as defined in claim 14, further comprising mounting said solar cell on a flexible film.

16. A method as defined in claim 11, further comprising removing the solar cell array from the vacuum chuck, turning the solar cell array upside down, reattaching the solar cell array to the vacuum chuck, and attaching the backside of the solar cell array to a flexible film.

17. A method as defined in claim 10, wherein depositing a sequence of layers comprises:
   forming the top subcell comprising a first semiconductor material with a first band gap and a first lattice constant;
   forming the bottom subcell comprising a second semiconductor material with a second band gap and a second lattice constant, wherein the second band gap is less than the first band gap and the second lattice constant is greater than the first lattice constant; and
   forming a lattice constant transition material positioned between the top subcell and the bottom subcell, said lattice constant transition material having a lattice constant that changes gradually from the first lattice constant to the second lattice constant.

18. A method as defined in claim 17, wherein said transition material is composed of any of the As, P, N, Sb based III-V compound semiconductors subject to the constraints of having the in-plane lattice parameter greater or equal to that of the top subcell and less than or equal to that of the bottom subcell, and having a band gap energy greater than that of the bottom subcell, and the band gap of the transition material remains constant at approximately 1.50 eV throughout its thickness.

19. A method as defined in claim 17, wherein the transition material is composed of a sequence of $(In_xGa_{1-x})_yAl_{1-y}As$ layers, with x and y selected such that the band gap of each layer remains constant throughout the thickness of the transition material.

20. A method as defined in claim 17, wherein said top subcell is composed of an GaInP, GaAs, GaInAs, GaAsSb, or GaInAsN emitter region and an GaAs, GaInAs, GaAsSb, or GaInAsN base region, and the bottom subcell is composed of an InGaAs base and emitter regions.

* * * * *